US008928644B2

(12) United States Patent
Kurokawa et al.

(10) Patent No.: US 8,928,644 B2
(45) Date of Patent: Jan. 6, 2015

(54) DISPLAY DEVICE AND METHOD FOR DRIVING DISPLAY DEVICE

(75) Inventors: Yoshiyuki Kurokawa, Sagamihara (JP); Takayuki Ikeda, Atsugi (JP); Hikaru Tamura, Zama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 469 days.

(21) Appl. No.: 13/027,583

(22) Filed: Feb. 15, 2011

(65) Prior Publication Data
US 2011/0205209 A1 Aug. 25, 2011

(30) Foreign Application Priority Data

Feb. 19, 2010 (JP) ................. 2010-034731

(51) Int. Cl.
*G09G 5/00* (2006.01)
*G06F 3/042* (2006.01)
*G01J 1/42* (2006.01)
*G01J 1/18* (2006.01)

(52) U.S. Cl.
CPC . *G01J 1/18* (2013.01); *G06F 3/042* (2013.01); *G01J 1/4204* (2013.01); *G01J 1/42* (2013.01)
USPC ............... 345/211; 345/60; 345/204

(58) Field of Classification Search
USPC ............ 345/60, 175, 204, 207, 211, 212
See application file for complete search history.

(56) References Cited

U.S. PATENT DOCUMENTS

| 4,605,882 A * | 8/1986 | DeLuca ................. 315/158 |
| 5,466,612 A * | 11/1995 | Fuse et al. ............... 438/60 |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,747,638 B2 | 6/2004 | Yamazaki et al. |
| 7,049,190 B2 | 5/2006 | Takeda et al. |
| 7,061,014 B2 | 6/2006 | Hosono et al. |

(Continued)

FOREIGN PATENT DOCUMENTS

| EP | 1737044 A | 12/2006 |
| EP | 2224319 A | 9/2010 |

(Continued)

OTHER PUBLICATIONS

International Search Report (Application No. PCT/JP2011/053613) Dated Mar. 22, 2011.

(Continued)

*Primary Examiner* — Premal Patel
(74) *Attorney, Agent, or Firm* — Eric J. Robinson; Robinson Intellectual Property Law Office, P.C.

(57) ABSTRACT

A display device includes a pixel which includes a first photosensor portion having a first photodiode for detecting visible light, which is provided together with a display element portion; and a pixel which includes a second photosensor portion having a second photodiode for detecting infrared rays, which is provided together with another display element portion. The second photosensor portion detects infrared rays included in external light, and selects an imaging element and adjusts sensitivity in accordance with the amount of infrared rays detected by the second photosensor portion.

12 Claims, 17 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,199,520 B2 | 4/2007 | Fujii et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,523 B2 | 4/2009 | Yamazaki et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0174324 A1* | 9/2004 | Yamazaki et al. ............. 345/76 |
| 2005/0017302 A1 | 1/2005 | Hoffman |
| 2005/0037815 A1 | 2/2005 | Besharat et al. |
| 2005/0146791 A1* | 7/2005 | Bechtel et al. ................ 359/604 |
| 2005/0199959 A1 | 9/2005 | Chiang et al. |
| 2006/0007224 A1 | 1/2006 | Hayashi et al. |
| 2006/0035452 A1 | 2/2006 | Carcia et al. |
| 2006/0043377 A1 | 3/2006 | Hoffman et al. |
| 2006/0044300 A1 | 3/2006 | Koyama et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0180774 A1* | 8/2006 | Endo ........................ 250/485.1 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0210257 A1* | 9/2007 | Masuda et al. ........... 250/370.09 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258047 A1* | 10/2008 | Sakakibara et al. ...... 250/214 C |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0143109 A1* | 6/2009 | Yamazaki ..................... 455/566 |
| 2009/0146967 A1 | 6/2009 | Ino et al. |
| 2009/0152506 A1 | 6/2009 | Umeda et al. |
| 2009/0152541 A1 | 6/2009 | Maekawa et al. |
| 2009/0201228 A1* | 8/2009 | Kim et al. .......... 345/60 |
| 2009/0237381 A1* | 9/2009 | Otani et al. .................... 345/207 |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2009/0321640 A1* | 12/2009 | Onogi ........................ 250/338.1 |
| 2010/0053348 A1* | 3/2010 | Yoshimoto et al. ........ 348/218.1 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0164921 A1 | 7/2010 | Ino et al. |
| 2010/0220077 A1 | 9/2010 | Fukunaga et al. |
| 2010/0225617 A1 | 9/2010 | Yoshimoto et al. |
| 2010/0283765 A1 | 11/2010 | Gotoh et al. |
| 2011/0198484 A1 | 8/2011 | Kurokawa |
| 2011/0242440 A1 | 10/2011 | Noma et al. |

FOREIGN PATENT DOCUMENTS

| | | |
|---|---|---|
| EP | 2226710 A | 9/2010 |
| EP | 2226847 A | 9/2010 |
| EP | 2381345 A | 10/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-292276 | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-018219 A | 1/2006 |
| JP | 2008-241807 A | 10/2008 |
| JP | 2009-139597 A | 6/2009 |
| JP | 2009-157349 A | 7/2009 |
| JP | 2010-198575 A | 9/2010 |
| JP | 2010-211324 A | 9/2010 |
| WO | WO-2004/114391 | 12/2004 |
| WO | WO-2009/110293 | 9/2009 |
| WO | WO-2010/084641 | 7/2010 |

OTHER PUBLICATIONS

Written Opinion (Application No. PCT/JP2011/053613) Dated Mar. 22, 2011.

Fortunato.E et al., "Wide-Bandgap High-Mobility ZnO Thin-Film Transistors Produced at Room Temperature,", Appl. Phys. Lett.

(56) References Cited

OTHER PUBLICATIONS (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 2, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Interger) Described by Four-Dimensinoal Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector with Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", Am-Fpd '09 Digest of Technical Papers, Jul. 1, 2009, pp. 227-230, The Japan Society of Applied Physics.

Coates.D at al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jini.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTS,", IDW '09: Proceedings of the 16h International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTS With a Novel Passivation Layer,", SID

(56) References Cited

OTHER PUBLICATIONS

Digest '09 : SID International Symposium Digest of Technical Papers, May 31, 2009, pp. 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest of Technical Papers, May 31, 2009, pp. 578-581.

Asaoka.Y et Al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges To, And Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,$YbFe_2O_4$, and $Yb_2Fe_3O_7$ Types of Structures for Compounds in the $In_2O_3$ and $Sc_2O_3$—$A_2O_3$—Bo Systems [A; Fe, Ga, or Al; B: Mg, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review, A), May 1, 1984, vol. 29, No. 5, pp. 2957-2959.

Meiboom.S et al., "Theory of the Blue Phase of Cholesteric Liquid Crystals,", Phys. Rev. Lett. (PHysical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID DIGEST '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Bys. Lett. (Applied PHysics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review), B), 2008, vol. 77, pp. 245202-1-245202-6.

Orita.M et al., "Amorphous transparent conductive oxide $InGaO_3(ZnO)_m$ (m<4):a Zn 4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett.(Applied Physics Letters), Sep. 1, 2003, vol. 83, No. 9, pp. 1755-1757.

\* cited by examiner

DISPLAY DEVICE AND METHOD FOR DRIVING DISPLAY DEVICE

TECHNICAL FIELD

Embodiments of the present invention relate to a display device in which pixels each having a photosensor are arranged in a matrix and to a driving method of the display device. Further, an embodiment of the present invention relates to an electronic device including the display device.

BACKGROUND ART

In recent years, a display device provided with a sensing element for detecting light (also referred to as a "photosensor") has attracted attention. A display device having a photosensor in a display region, which can detect a touch of an object to be detected (e.g., a pen and a finger) on the display region, is also called a touch panel, a touch screen, or the like (hereinafter simply called a "touch panel"). Such a photosensor provided in the display region enables the display region to double as an input region; as an example, a semiconductor device having an image loading function has been disclosed in Patent Document 1.

REFERENCE

Patent Document

[Patent Document 1] Japanese Published Patent Application No. 2001-292276

DISCLOSURE OF INVENTION

In such a display device having a photosensor, external light easily affects imaging accuracy. When the human living environment is considered, dim indoor illuminance and outdoor illuminance under sunlight differ by approximately 10000 times or more. Within this wide range of illuminance, it is difficult to make a photosensor recognize the contrast uniformly; thus, false recognition has occurred when the display device having the photosensor is used as a touch panel.

In addition, in the case where the display device having the photosensor is used as an image sensor, it is necessary to adjust the sensitivity of a photosensor in accordance with the illuminance of light detected by the photosensor so that imaging is performed within the wide dynamic range. When the photosensor does not have adequate sensitivity, a clear imaging cannot have been performed due to underexposure or overexposure.

Thus, one embodiment of the present invention disclosed herein solves at least one of the above problems.

One embodiment of the present invention relates to a display device including a pixel having a photosensor capable of detecting infrared rays and a pixel having a photosensor capable of detecting visible light, where external light intensity is determined by detecting an infrared ray, a photosensor used for imaging is selected, and the sensitivities of the photosensors are set automatically.

One embodiment of the present invention disclosed in this specification is a display device which includes a display element portion formed in a pixel of a display region, a first photosensor portion formed in the pixel, which is provided together with the display element portion, and a second photosensor portion formed in another pixel without the first photosensor portion, which is provided together with another display element portion, where the first photosensor portion is provided with a first photodiode for detecting visible light, and where the second photosensor portion is provided with a second photodiode for detecting an infrared ray.

For the first photodiode, a PIN-type or PN-type photodiode including a silicon semiconductor can be used. Specifically, a PIN-type photodiode in which an amorphous silicon semiconductor which has light absorption characteristics in a wavelength region of visible light is used for an i-type semiconductor layer is preferable.

For the second photodiode, a PIN-type or PN-type photodiode including a silicon semiconductor can be used. Specifically, a PIN-type photodiode in which a microcrystalline silicon semiconductor which can be easily formed as thin film crystalline silicon and has light absorption characteristics in a wavelength region of an infrared ray is used for an i-type semiconductor layer is preferable. At this time, only an infrared ray can be detected when a filter which transmits infrared rays and absorbs visible light is provided over a light receiving surface of the photodiode.

Another embodiment of the present invention disclosed in this specification is a method for driving a display device which includes a display element portion formed in a pixel of a display region, a first photosensor portion formed in the pixel, which is provided together with the display element portion, and a second photosensor portion formed in another pixel without the first photosensor portion, which is provided together with another display element portion. The method for driving the display device includes the steps of external light entering the display region, detecting an infrared ray included in the external light by the second photosensor portion, selecting either the first photosensor portion or the second photosensor portion as a unit (means) which is used for imaging in accordance with the amount of infrared rays detected by the second photosensor portion, performing imaging using visible light when the first photosensor portion is used, and performing imaging using an infrared ray when the second photosensor portion is used.

Another embodiment of the present invention disclosed in this specification is a method for driving a display device which includes a display element portion formed in a pixel of a display region, a first photosensor portion formed in the pixel portion, which is provided together with the display element portion, and a second photosensor portion formed in another pixel without the first photosensor portion, which is provided together with another display element portion. The method for driving the display device includes the steps of changing light reception sensitivity of the first photosensor portion by intensity of an infrared ray which is detected by the second photosensor portion when light is received, converting intensity of light detected by the first photosensor portion to signals, forming from the signals a histogram where a horizontal axis represents gray scales, counting gray scales of the histogram from the gray scales in a dark side, setting a gray scale which reaches a count number set in advance to a threshold value, performing binarization of an image at a boundary of the threshold value to obtain a bright portion and a dark portion, and determining a position of an object in the display region using an address of a pixel of the dark portion.

Another embodiment of the present invention disclosed in this specification is a method for driving a display device which includes a display element portion formed in a pixel of a display region, a first photosensor portion formed in the pixel, which is provided together with the display element portion, and a second photosensor portion formed in another pixel without the first photosensor portion, which is provided together with another display element portion. The method for driving the display device includes the steps of external light entering the display region, detecting an infrared ray included in the external light by the second photosensor portion, selecting either the first photosensor portion or the second photosensor portion as a unit (means) which is used for imaging in accordance with the amount of infrared rays detected by the second photosensor portion, performing imaging using visible light when the first photosensor portion is used, performing imaging using an infrared ray when the second photosensor portion is used, converting intensity of light detected by the first photosensor portion or the light detected by the second photosensor portion to signals, forming from the signals a histogram where a horizontal axis represents gray scales, counting gray scales of the histogram from the gray scales in a dark side, setting a gray scale which reaches a count number set in advance to a threshold value, performing binarization of an image at a boundary of the threshold value to obtain a bright portion and a dark portion, and determining a position of an object to be detected in the display region using an address of a pixel of the dark portion.

According to one embodiment of the present invention, a display device having a touch panel function capable of preventing false recognition due to the effect of external light and a function capable of performing imaging within the wide dynamic range can be provided.

BEST MODE FOR CARRYING OUT THE INVENTION

Figure 1:
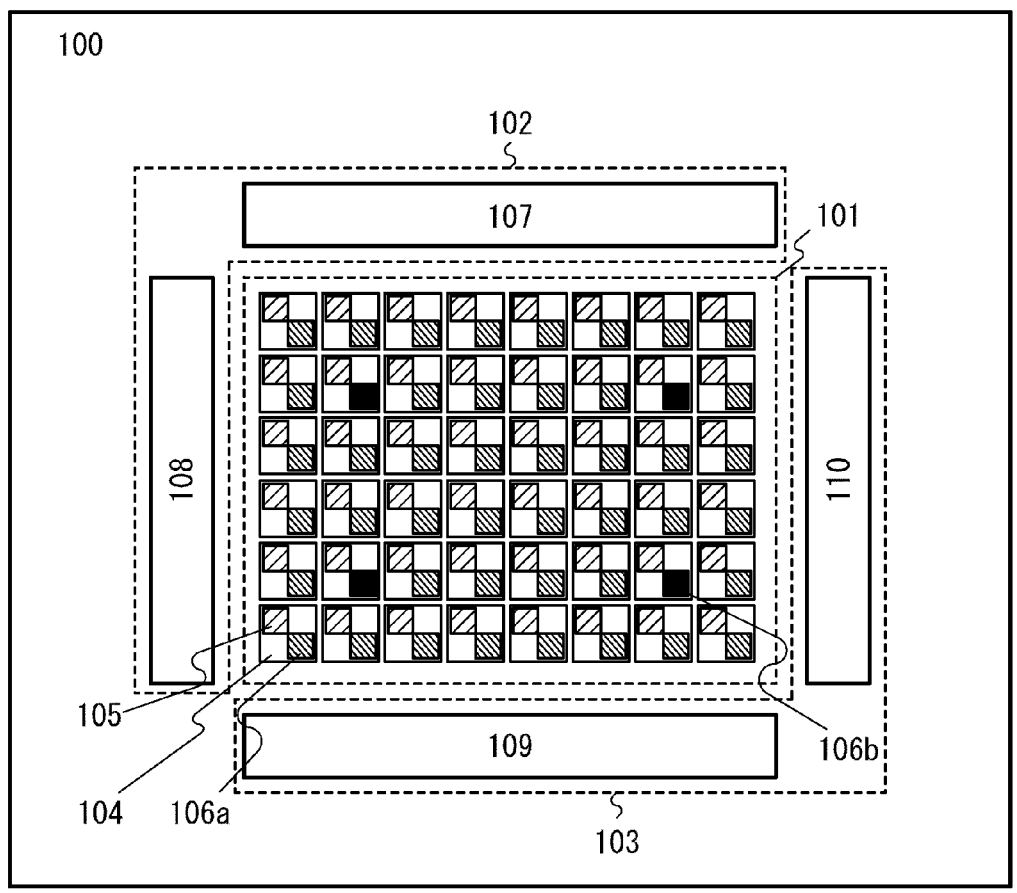
FIG. 1 illustrates a structure of a display device where a display region is provided with both a display element and a photosensor.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments below. In the drawings for describing the embodiments, the same portions or portions having a similar function are denoted by the same reference numerals, and description of such parts is not repeated.

Embodiment 1

In this embodiment, a display device according to one embodiment of the present invention will be described with reference to drawings. FIG. 1 illustrates an example of a structure thereof.

A display device 100 includes a pixel circuit 101, a display element control circuit 102, and a photosensor control circuit 103. The pixel circuit 101 includes a plurality of pixels 104 arranged in a matrix of rows and columns. Each pixel 104 includes a display element portion 105, and a first photosensor portion 106a or a second photosensor portion 106b, for example.

The first photosensor portion 106a is provided to obtain an image, and the second photosensor portion 106b is provided mainly to detect the intensity of external light. Note that in some cases, imaging is performed with the second photosensor portion 106b.

It is not necessary to provide the photosensor portions for all the pixels, and the photosensor portions may be formed in accordance with a purpose. Moreover, the pixel circuit 101 which is occupied with a number of first photosensor portions 106a as illustrated in FIG. 1 is merely an example, and may be occupied with a number of second photosensor portions 106b.

The display element control circuit 102 illustrated in FIG. 1 is a circuit for controlling the display element portions 105 and includes a display element driver circuit 107 which inputs a signal to the display element portions 105 through source signal lines (such as video-data signal lines) and a display element driver circuit 108 which inputs a signal to the display element portions 105 through gate signal lines (scan lines).

For example, the display element driver circuit 108 has a function of selecting the display element portion included in each of the pixels in a particular row. The display element driver circuit 107 has a function of supplying a given potential to the display element portion included in each of the selected pixels in the row. Note that in the display element portion where a high potential is applied to the gate signal line from the display element driver circuit 108, a transistor is turned on and supplied with a potential applied to the source signal line from the display element driver circuit 107.

The photosensor control circuit 103 is a circuit for controlling the first photosensor portion 106a and the second photosensor portion 106b and includes a photosensor reading circuit 109 connected to a photosensor output signal line (hereinafter referred to as an output signal line), a photosensor reference signal line (hereinafter referred to as a reference signal line), and the like, and a photosensor driver circuit 110 connected to a photodiode reset signal line (hereinafter referred to as a reset signal line), a gate signal line for line selection (hereinafter referred to as a selection signal line), and the like.

The photosensor driver circuit 110 has a function of performing a reset operation, an accumulation operation, and a selection operation which will be described later on the first photosensor portion 106a and the second photosensor portion 106b included in each of the pixels in a particular row. Further, the photosensor reading circuit 109 has a function of extracting output signals of the photosensor portions included in each of the selected pixels in the row. Note that the photosensor reading circuit 109 can have a system in which an output, which is an analog signal, of the photosensor portions is extracted as an analog signal to the outside by an OP amplifier; or a system in which the output is converted into a digital signal by an A/D converter circuit and then extracted to the outside.

Note that the output signals of the first photosensor portion 106a and the second photosensor portion 106b can be read by driving the photosensor portions with the above circuits in common. When the addresses of the photosensor portions are known, the processes for the signals can be changed at the time of the reading.

A circuit diagram of the pixel 104 is described with reference to FIG. 2. The pixel 104 includes the display element portion 105 including a transistor 201, a storage capacitor 202, and a liquid crystal element 203, and the first photosensor portion 106a including a first photodiode 204a, a transistor 205, and a transistor 206.

Note that the description is made here on the first photosensor portion 106a including the first photodiode 204a; however, the second photosensor portion 106b including a second photodiode 204b can have a similar structure.

In the transistor 201 of the display element portion 105, a gate thereof is electrically connected to a gate signal line 207, one of a source and a drain thereof is electrically connected to a source signal line 210, and the other of the source and the drain thereof is electrically connected to one of electrodes of the storage capacitor 202 and one of electrodes of the liquid crystal element 203. The other of the electrodes of the storage capacitor 202 and the other of the electrodes of the liquid crystal element 203 are each held at a constant potential. The liquid crystal element 203 is an element including a liquid crystal layer interposed between a pair of the electrodes.

The transistor 201 has a function of controlling injection or discharge of electric charges to/from the storage capacitor 202. For example, when a high potential is applied to the gate signal line 207, the potential of the source signal line 210 is applied to the storage capacitor 202 and the liquid crystal element 203. The storage capacitor 202 has a function of retaining an electric charge corresponding to a voltage applied to the liquid crystal element 203.

Image display is realized in such a manner that the contrast (gray scale) of light passing through the liquid crystal element 203 is made by utilizing a phenomenon in which the polarization direction is changed by applying voltage to the liquid crystal element 203. In the case of a transmissive liquid crystal display device, a backlight is used for a light source of light passing through the liquid crystal element 203.

As the transistor 201, a semiconductor layer of amorphous silicon, microcrystalline silicon, polycrystalline silicon, or the like can also be used; however, an oxide semiconductor is preferably used. In a transistor including an oxide semiconductor, characteristics with extremely low off-state current are shown; thus, a function of holding electric charges can be improved.

Although the display element portion 105 described here includes the liquid crystal element, the display element portion 105 may include other elements such as a light-emitting element. The light-emitting element is an element in which the luminance is controlled by current or voltage. Specifically, a light-emitting diode (LED), an organic light-emitting diode (OLED), and the like are given.

In the first photodiode 204a of the first photosensor portion 106a, an anode thereof is electrically connected to a reset signal line 208, and a cathode thereof is electrically connected to a gate of the transistor 205 through a gate signal line 213. In the transistor 205, one of a source and a drain thereof is electrically connected to a reference signal line 212, and the other of the source and the drain thereof is electrically connected to one of a source and a drain of the transistor 206. In the transistor 206, a gate thereof is electrically connected to a selection signal line 209, and the other of the source and the drain thereof is electrically connected to an output signal line 211.

For the first photodiode 204a of the first photosensor portion 106a and the second photodiode 204b of the second photosensor portion 106b, a PIN-type or PN-type photodiode including a silicon semiconductor can be used.

For the first photodiode 204a, which performs an imaging operation that provides a display device with a touch panel function or an image sensor function, a photodiode which has light absorption characteristics in a wavelength region of visible light is preferable. Here, for the photodiode, a PIN-type photodiode in which amorphous silicon is used for an i-type semiconductor layer is used.

For the second photodiode 204b, which mainly performs external light detection, which will be described later, a photodiode which can be easily formed and has light absorption characteristics in a wavelength region of an infrared ray is preferable. Here, for the photodiode, a PIN-type photodiode in which microcrystalline silicon is used for an i-type semiconductor layer is used. At this time, only an infrared ray can be detected when a filter which transmits infrared rays and absorbs visible light is provided over a light receiving surface of the photodiode.

The transistor 205 has a role of amplification of an electric signal generated by the first photodiode 204a; therefore, high mobility characteristics are necessary. Further, in order to prevent unnecessary potential from being outputted to the output signal line 211, it is preferable that the transistor 205 have low off-state current characteristics. Therefore, although a transistor including a silicon semiconductor can also be used as the transistor 205, it is more preferable to use a transistor including an oxide semiconductor having extremely low off-state current characteristics.

The transistor 206 is a selection transistor for outputting the signal amplified by the transistor 205 to the output signal line 211. In order to prevent unnecessary potential from being outputted to the output signal line 211, it is preferable that the transistor 206 also have low off-state current characteristics. Thus, as in the above case of the transistor 205, it is preferable to form a transistor including an oxide semiconductor.

For example, for the oxide semiconductor, a thin film represented by the chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

Next, a precharge circuit included in the photosensor reading circuit 109 is described. In FIG. 2, a precharge circuit 300 for one column of pixels includes a transistor 301, a storage capacitor 302, and a precharge signal line 303. Here, a p-channel transistor is used as the transistor 301. Note that an OP amplifier or an A/D converter circuit can be connected to a subsequent stage of the precharge circuit 300.

In the precharge circuit 300, before the operation of the photosensor portion in the pixel, the potential of the output signal line 211 is set at a reference potential. In the configuration of FIG. 2, the precharge signal line 303 is set at "L (Low)" so that the transistor 301 is turned on, whereby the potential of the output signal line 211 can be set at a reference potential (here, a high potential). The storage capacitor 302 is provided for the output signal line 211 so that the potential of the output signal line 211 is stabilized. Note that it is acceptable that the storage capacitor 302 is not provided if the output signal line 211 has large parasitic capacitance. Note that the reference potential may be set at a low potential. In that case, the precharge signal line 303 is set at "H (High)" with the use of an n-channel transistor as the transistor 301, whereby the potential of the output signal line 211 can be set at a low potential.

Figure 3:
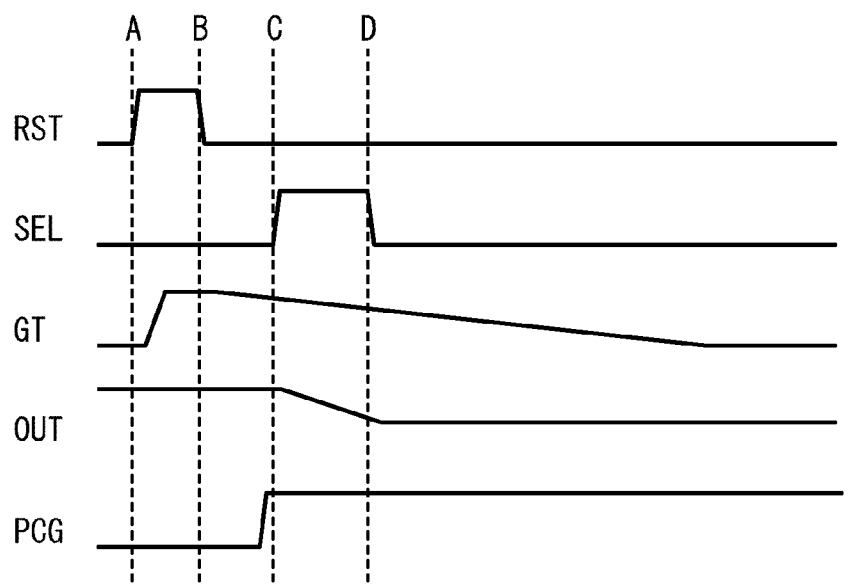
FIG. 3 is a timing chart of the operations of a photo sensor.

Next, reading operations of the photosensor portions provided for the display device in this embodiment is described with reference to a timing chart in FIG. 3. In FIG. 3, a potential of the reset signal line 208 (RST), a potential of the selection signal line 209 (SEL), a potential of the gate signal line 213 (GT), a potential of the output signal line 211 (OUT), and a potential of the precharge signal line 303 (PCG) are shown sequentially from the top. Note that in the following description on the reading operation of the photosensor portion, the first photodiode 204a can be described as the second photodiode 204b.

At time A, the potential (RST) of the reset signal line 208 is set at "H", so that the first photodiode 204a is forward biased and the potential (GT) of the gate signal line 213 becomes a reset potential. This reset potential is lower than the "H" potential of the potential (RST) of the reset signal line 208 by a forward voltage ($V_f$) of the first photodiode 204a. This reset potential is retained in the signal electric charge accumulation portion formed by a parasitic capacitance of the gate signal line 213 and a capacitance of the gate portion of the transistor 205. This step is a beginning of a reset operation.

Further, the potential (PCG) of the precharge signal line 303 is set at "L", so that the potential (OUT) of the output signal line 211 is precharged to "H", and this can be performed anytime before the transistor 205 is turned on, without being limited to the time A.

At time B, the potential (RST) of the reset signal line 208 is set at "L", so that current of the first photodiode 204a flows in the inverse direction in accordance with the illuminance, which lowers the potential (GT) of the gate signal line 213 from the reset potential. This step is a beginning of an accumulation operation. As a result, current that flows between the source and the drain of the transistor 205 varies.

Next, the potential of the precharge signal line 303 (PCG) is set at "H" and precharge of the output signal line 211 (OUT) is completed.

At time C, when the potential of the selection signal line 209 (SEL) is set at "H", the transistor 206 is turned on, and the reference signal line 212 whose potential is set at, for example, a ground potential and the output signal line 211 are electrically connected to each other through the transistor 205 and the transistor 206. This step is a beginning of a selection operation. Here, the rate at which the potential of the output signal line 211 (OUT) decreases depends on the current between the source and the drain of the transistor 205. That is, the rate at which the potential of the output signal line 211 decreases varies in accordance with the amount of light with which the first photodiode 204a is irradiated. Note that the potential of the reference signal line 212 is not limited to the ground potential, and an appropriate potential may be supplied thereto.

At time D, when the potential of the selection signal line 209 (SEL) is set at "L", the transistor 206 is turned off, so that the potential of the output signal line 211 (OUT) is kept at a constant value. This step is end of the accumulation operation and the selection operation. Here, the potential (OUT) of the output signal line 211 is one which is changed depending on the amount of light with which the first photodiode 204a is irradiated during the accumulation operation. Therefore, the amount of light with which the first photodiode 204a is irradiated during the accumulation operation can be found by detecting the potential (OUT) of the output signal line 211.

The reset operation, the accumulation operation, and the selection operation are repeated per row of a pixel matrix in sequence, whereby an object to be detected which is touched or is close to the display panel can be imaged.

The above series of operations are an example in the case where the cathode of the first photodiode 204a is connected to the gate of the transistor 205. Such an operation of generating an output signal can also be performed with the case where the anode of the first photodiode 204a is connected to the gate of the transistor 205.

According to the above series of operations, the potential (GT) of the gate signal line 213 is initialized to "H" and discharged by current in the inverse direction generated by light with which the first photodiode 204a is irradiated, and an output signal is determined through the transistor 205.

Figure 2:
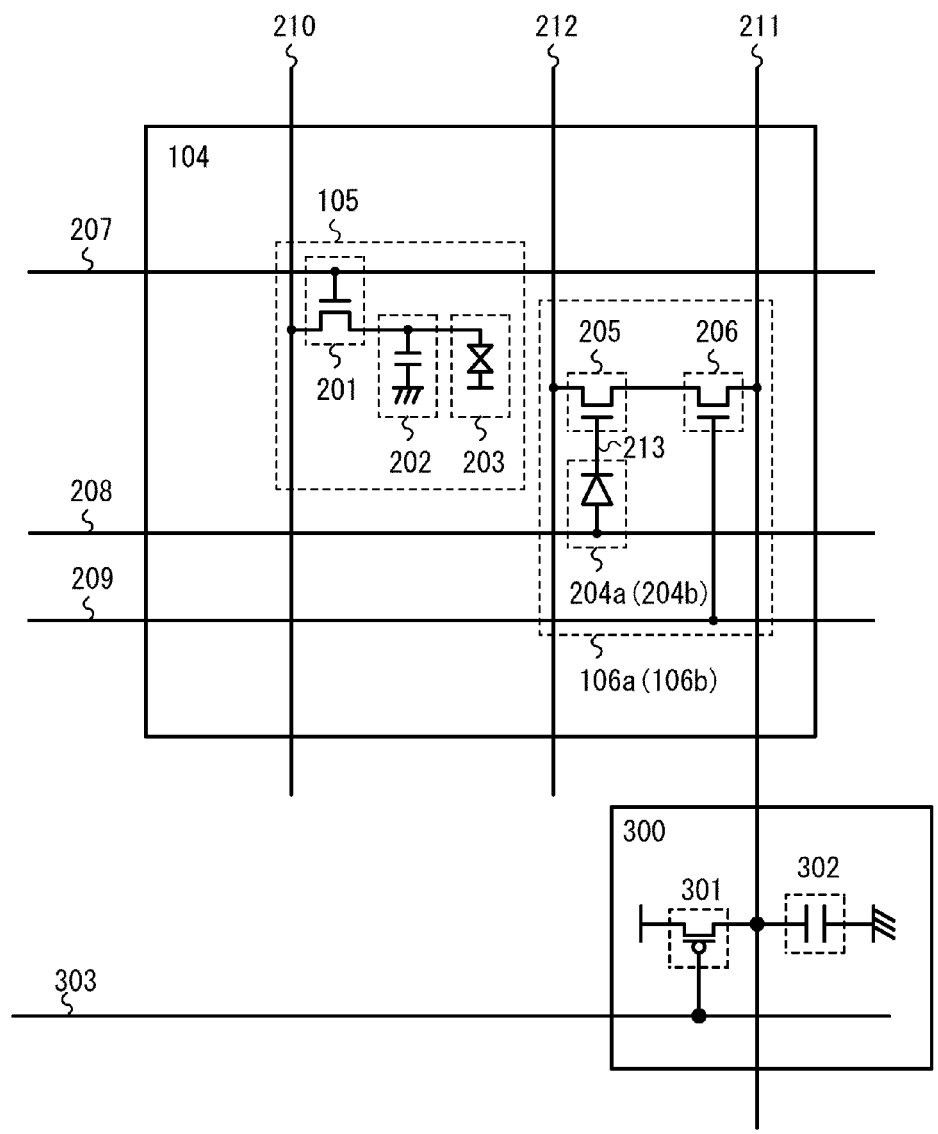
FIG. 2 is a circuit diagram having a configuration of a display device where a display region is provided with both a display element and a photosensor.

On the other hand, in the case where the first photodiode 204a is connected inversely with respect to the first photodiode 204a illustrated in FIG. 2, the potential (GT) of the gate signal line 213 is initialized to "L" and charged by current in the inverse direction occurred by light with which the first photodiode 204a is irradiated, and an output signal can be determined through the transistor 205.

In a display device having a photosensor, in some cases, imaging accuracy deteriorates under an environment with strong external light. When the human living environment is considered, dim indoor illuminance and outdoor illuminance under sunlight differ by approximately 10000 times or more.

Therefore, when the sensitivity of the first photosensor portion 106a of the display device having a photosensor, which is used for an image sensor, is fixed to the use for high illuminance like outdoor use, the display device having a photosensor can be used for outdoor imaging without problem but cause underexposure when used indoors. On the other hand, when the sensitivity of the first photosensor portion 106a is fixed to the use for low illuminance, there is a problem in that overexposure is caused under high illuminance. Moreover, when the display device having a photosensor is used for a touch panel under high illuminance or low illuminance, the first photosensor portion 106a cannot recognize sufficiently the change of illuminance; thus, false recognition has occurred on the input operation. One embodiment of the present invention has a structure in which the sensitivity of the photosensor portion can be switched automatically in order to solve the above problems.

The display device according to one embodiment of the present invention recognizes illuminance of external light by detecting infrared rays included in the external light, and includes the second photosensor portion 106b which has a role of determination of the sensitivity of the first photosensor portion 106a which is used for imaging. Therefore, regardless of illuminance of external light, the display device can always operate stably.

Although a large amount of infrared rays is included in sunlight, few infrared ray is included in light emitted from a fluorescent bulb or a light-emitting diode which is used as a unit (means) for generating visible light. That is, whether the external environment where the display device is placed is indoors or outdoors can be easily determined by the amount of infrared rays which are detected by the second photosensor portion 106*b*. Accordingly, when the display device is provided with a function of changing the sensitivity of the first photosensor portion 106*a* in accordance with the illuminance, the above problems can be solved.

Figure 4:
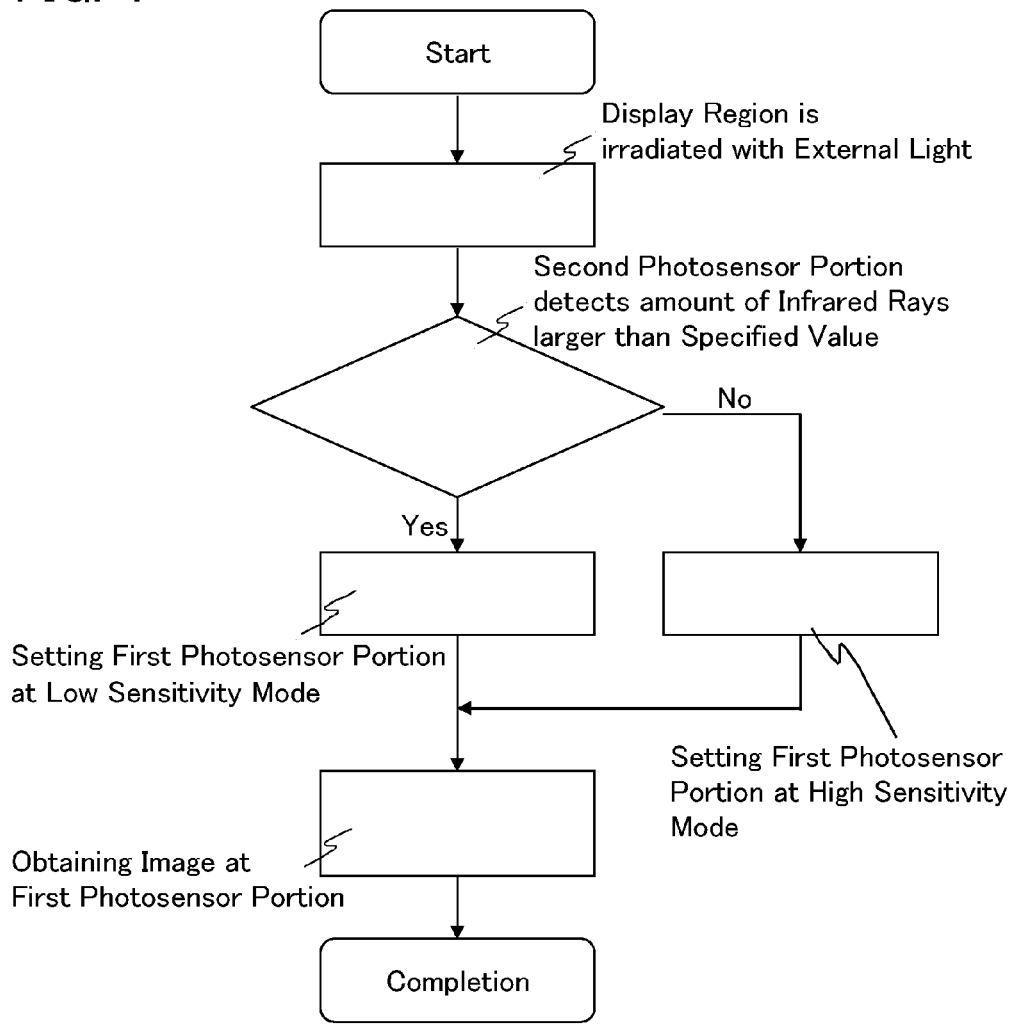
FIG. 4 is a flow chart of the operations of a photosensor.

Specific operations of the above are described with reference to a flow chart. FIG. 4 is a flow chart for describing part of operations of the case where the display device functions as an image sensor or a touch panel.

First, the display region of the display device is irradiated with external light. At this time, the second photosensor portion 106*b* detects infrared rays included in the irradiation external light, and the display device determines whether the amount of detected infrared rays is larger or smaller than the specified value. Here, the specified value of the amount of infrared rays is larger than, for example, the amount of detected infrared rays in the case of irradiation light including an infrared ray of an incandescent lamp or the like under an indoor environment where the display device is assumed to be used normally.

When the amount of detected infrared rays is larger than the specified value, the display device determines that the external environment is outdoors, and the first photosensor portion 106*a* which is used for imaging is set at a low sensitivity mode. On the other hand, when the amount of detected infrared rays is smaller than the specified value, the display device determines that the external environment is indoors, and the first photosensor portion 106*a* is set at a high sensitivity mode.

Then, imaging is started.

Here, an example of how to set sensitivity is described with the above description on the operation of the photosensor. In the above low sensitivity mode, saturation of a signal which has been converted from light is suppressed.

For example, it is assumed that a reset potential is supplied to the gate signal line 213, a large amount of reverse current of the photodiode flows by irradiation of light having illuminance A, a potential of the gate signal line 213 becomes constant during the accumulation operation time, and a potential a is obtained. In such a situation, the potential of the gate signal line 213 becomes constant, i.e. the potential a even when irradiation of light having illuminance B which is higher than the illuminance A is performed. Thus, the result similar to the illuminance A is obtained. In other words, the illuminance A and the illuminance B cannot be determined in this situation.

There is a method for shortening the accumulation operation time as an example of determining the illuminance A and the illuminance B by the photosensor. By shortening the time, the potential of the gate signal line 213 does not vary until it becomes constant and the potential becomes potentials corresponding to the illuminance A and the illuminance B; thus, the illuminance A and the illuminance B can be determined.

The illuminance A and the illuminance B can be determined also by a method in which a reset potential is varied and the potential of the gate signal line 213 is made not to be constant within the accumulation operation time. It is needless to say that both the reset potential and the accumulation operation time may be varied.

On the other hand, in a high sensitivity mode, a signal which has been converted from light is prevented from being mixed with noise. The accumulation operation time and the reset potential may be reverse to those of the low sensitivity mode.

The sensitivity of the photosensor can be set by thus changing the reading condition of the photosensor.

Further, the display device according to one embodiment of the present invention can operate in a manner different from that of the flow chart in FIG. 4. Note that although this operation can also be used for an image sensor, it is preferable that the operation be mainly used for a touch panel because, in this operation, an infrared ray is used for imaging.

This operation is needed from the following background. The characteristics of the first photodiode 204*a* including amorphous silicon, which is formed in the first photosensor portion 106*a*, show almost linear outputs from low illuminance to high illuminance. However, in the case where illuminance is too high, for example, the case under direct sunlight, the slope becomes small with the effect of direct resistance with respect to output current; thus, the output becomes non-linear in some cases.

On the other hand, also in an illuminance region where the outputs of the first photosensor portion 106*a* show non-linearity, the outputs of the second photosensor portion 106*b* having appropriate sensitivity to an infrared ray can show linearity. In other words, under an environment where illuminance is extremely high, the second photosensor portion 106*b* functions as imaging instead of the first photosensor portion 106*a*, whereby false recognition which might occur in the case where the display device is used for a touch panel can be prevented.

The above operations are described with reference to a flow chart in FIG. 5.

First, the display region of the display device is irradiated with external light. At this time, the second photosensor portion detects infrared rays included in the irradiation external light, and the display device determines whether the amount of detected infrared rays is larger or smaller than a specified value A. Here, the specified value A of the amount of infrared rays is larger than, for example, the amount of detected infrared rays in the case of irradiation light including an infrared ray of an incandescent lamp or the like under an indoor environment where the display device is assumed to be used normally.

When the amount of detected infrared rays is smaller than the specified value A, the display device determines that the external environment is indoors, and the first photosensor portion 106*a* which is used for imaging is set at a high sensitivity mode. The following operations are the same as those of the flow chart in FIG. 4.

On the other hand, when the amount of detected infrared rays is larger than the specified value A, the display device further determines whether the amount of detected infrared rays is larger or smaller than a specified value B. This specified value B is set to illuminance at which the outputs of the first photodiode 204*a* which is used for the first photosensor portion 106*a* start to show non-linearity.

When the amount of infrared rays is smaller than the specified value B, the display device determines that the external environment is outdoors, and the first photosensor portion 106*a* is set at a low sensitivity mode. The following operations are the same as those of the flow chart in FIG. 4.

Further, when the amount of infrared rays is larger than the amount of specified value B, imaging is started in the display device using the second photosensor portion 106*b*.

Figure 5:
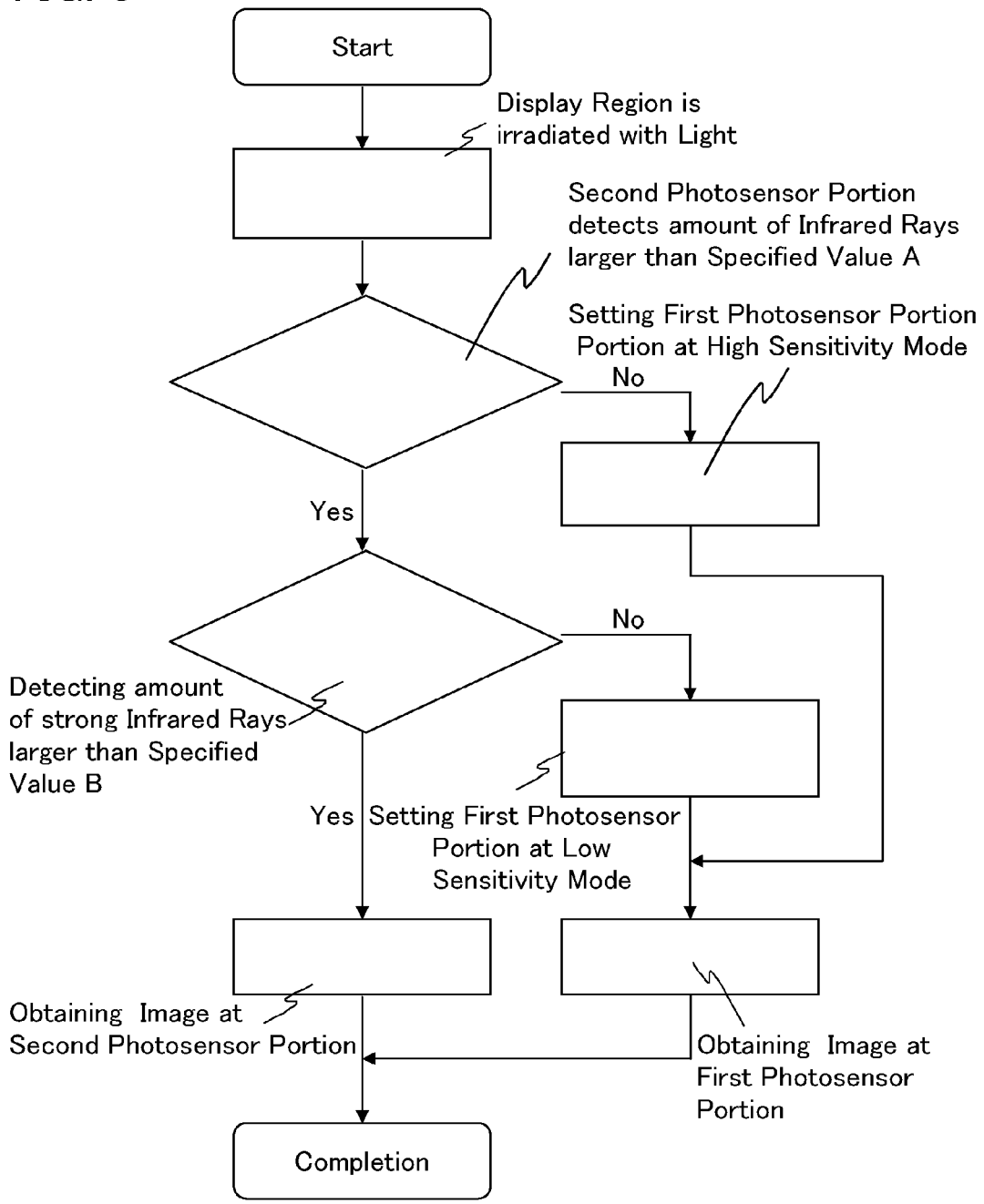
FIG. 5 is a flow chart of the operations of a photosensor.

In such a manner, the operations illustrated in the flow chart in FIG. 5 greatly differ from the operations illustrated in the flow chart in FIG. 4 in that imaging is performed using an infrared ray.

Next, the second photodiode 204b which is used for the second photosensor portion 106b for detecting infrared rays is described. Note that in this specification, an infrared ray refers to light whose wavelength is in the range of from approximately 0.7 μm to 1.2 μm.

Figure 6:
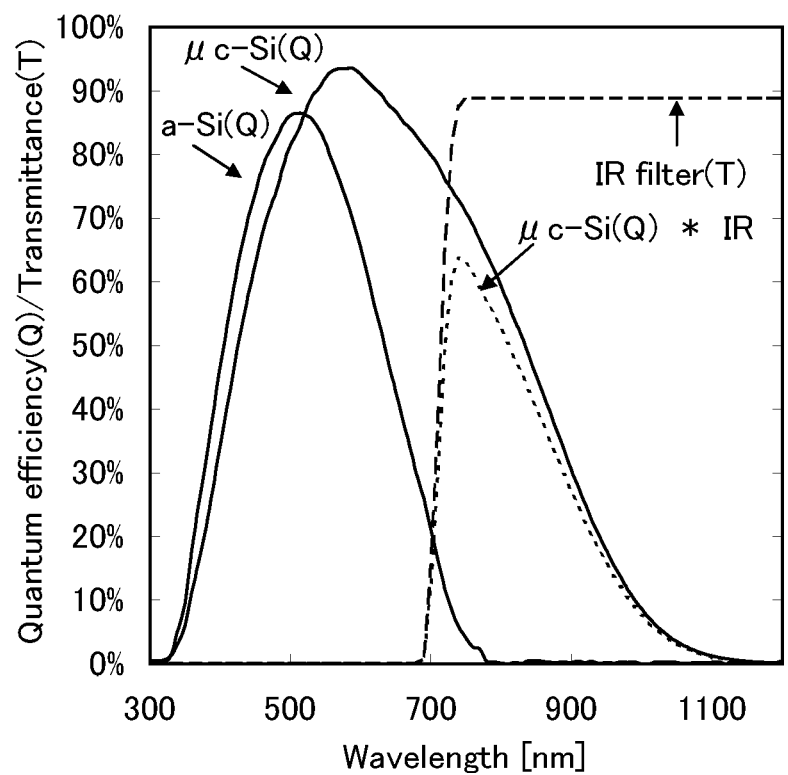
FIG. 6 is a graph showing the spectral sensitivity of a photodiode and the transmittance of an infrared-ray transmitting filter.

FIG. 6 shows the spectral sensitivity characteristics (quantum efficiency) of a PIN-type photodiode using amorphous silicon or microcrystalline silicon for an i-type semiconductor layer and the transmittance of a general infrared-ray transmitting filter.

FIG. 6 shows that, whereas the PIN-type photodiode using amorphous silicon has sensitivity almost in the range of visible light, the PIN-type photodiode using microcrystalline silicon has sensitivity also in a wavelength region of an infrared ray.

The curve which is obtained by multiplying the quantum efficiency of the PIN-type photodiode using microcrystalline silicon and the transmittance of the infrared-ray transmitting filter shows sensitivity to infrared rays of the photodiode. Note that the loss of light which is not transmitted through the infrared-ray transmitting filter is not considered. Therefore, it is found that the second photodiode 204b using microcrystalline silicon can detect infrared rays in combination with the infrared-ray transmitting filter.

As described above, a display device having a touch panel function capable of preventing false recognition due to the effect of external light and an image sensor function capable of performing imaging within the wide dynamic range can be provided.

This embodiment can be implemented in combination with any of the other embodiments or the examples as appropriate.

Embodiment 2

In this embodiment, a method for processing a signal outputted from a photosensor which is mounted on a display device and making the display device function as a touch panel will be described.

In order that the display device on which a photosensor is mounted recognizes contact on a surface of the display device by a finger, a pen, or the like, it is necessary to image shadows which are caused by shielding external light with the finger, the pen, or the like.

Figure 7A:
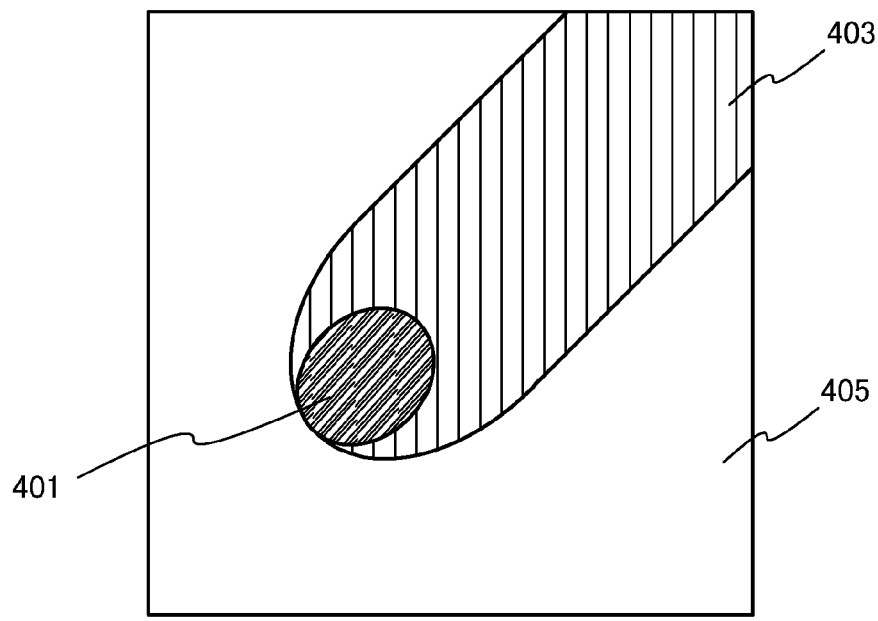
FIGS. 7A and 7B illustrate images obtained by a photosensor.
Figure 7B:
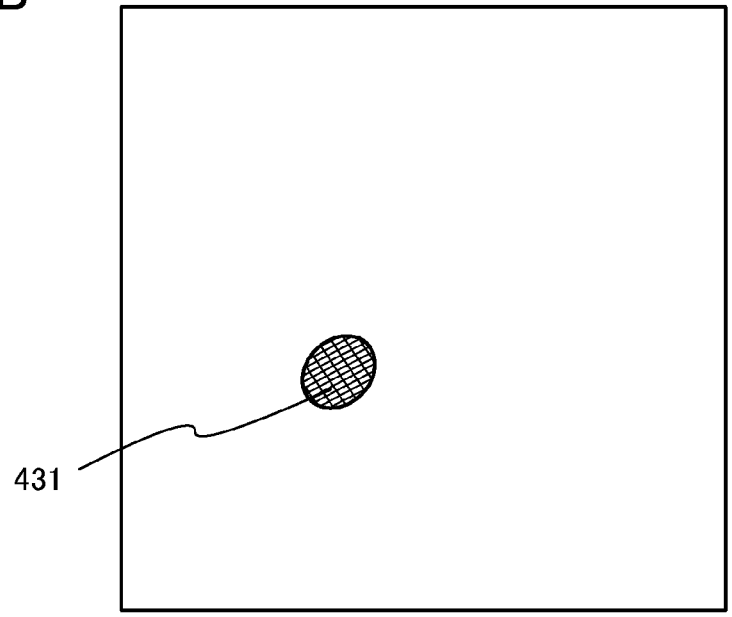

The shadows are imaged and the position in a display region is recognized in the following manner. First, the target position in the display region is made in contact with a finger or a pen, an imaging operation is performed on the entire display region or part thereof, and thus an image of FIG. 7A is obtained. Next, as illustrated in FIG. 7B, a process for displaying a tone of the shadows with two gray scales is performed, and binary (white and black) determination is performed. Then, the position of the shadow (black) is extracted as a contact position. The above process can be performed using software and a CPU or using dedicated hardware.

Next, the above binary determination method is described. The shadows caused by a finger or a pen have different tones depending on intensities of external light. In some cases, the shadows include not only a shadow of a fingertip or a pen nib in contact but also a shadow of a palm, a main body of the pen, or the like. Therefore, it is important to set the threshold value which is used in performing the above binary determination. Here, the threshold value refers to a boundary for distinguishing a contrast.

Figure 8:
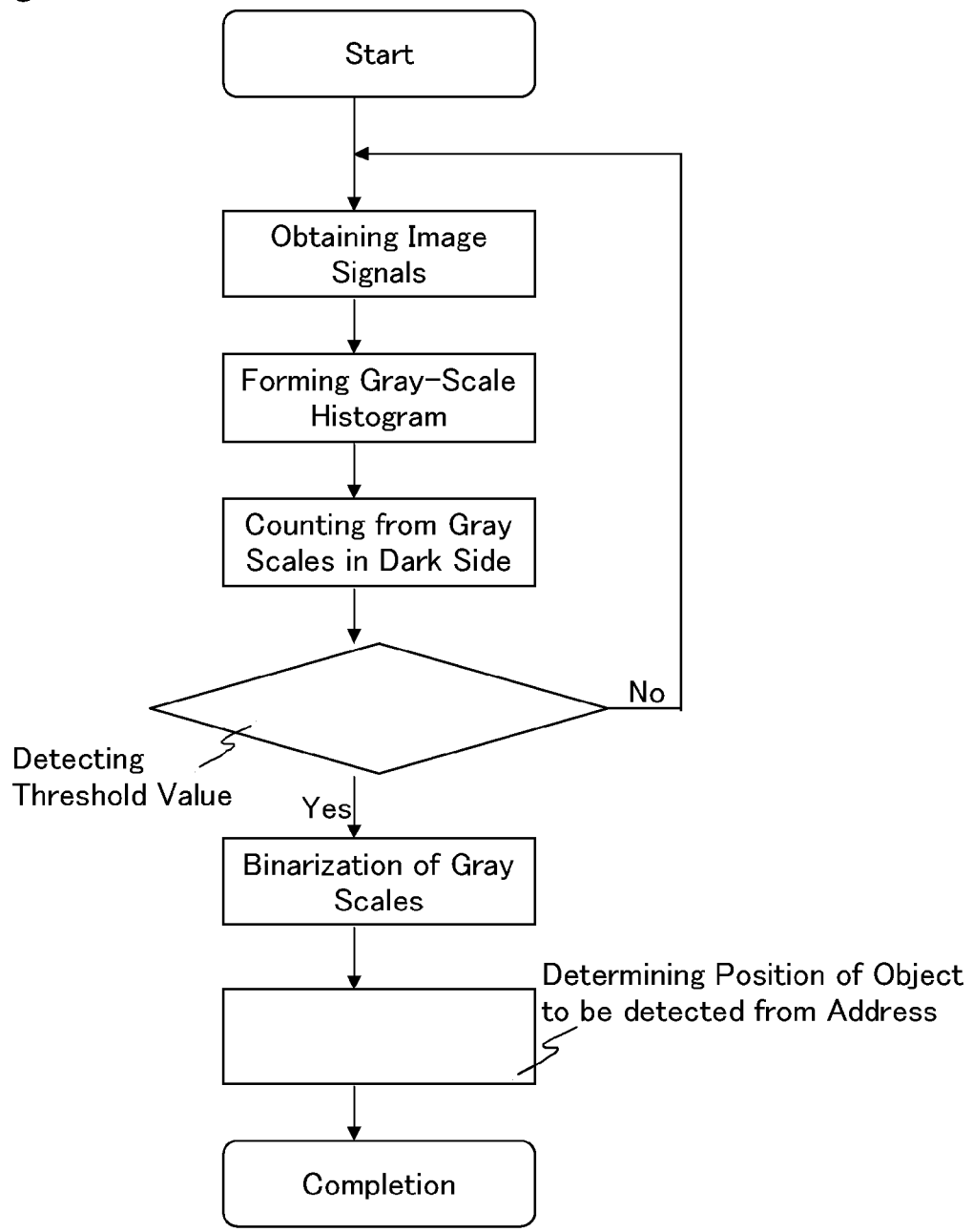
FIG. 8 is a flow chart describing a binarization process.

The method for setting the threshold value and the binary determination method in this embodiment is described in detail with reference to a flow chart in FIG. 8.

First, image signals are obtained. Here, signals of the image illustrated in FIG. 7A are to be obtained as an example. Next, a gray-scale histogram is formed from the obtained image signals. The image of FIG. 7A can be largely divided into a region 401 with a dark shadow of a fingertip, a pen nib, or the like, a region 403 with a light shadow of a finger, a main body of a pen, or the like, and a region 405 where a shadow is not caused.

Figure 9A:
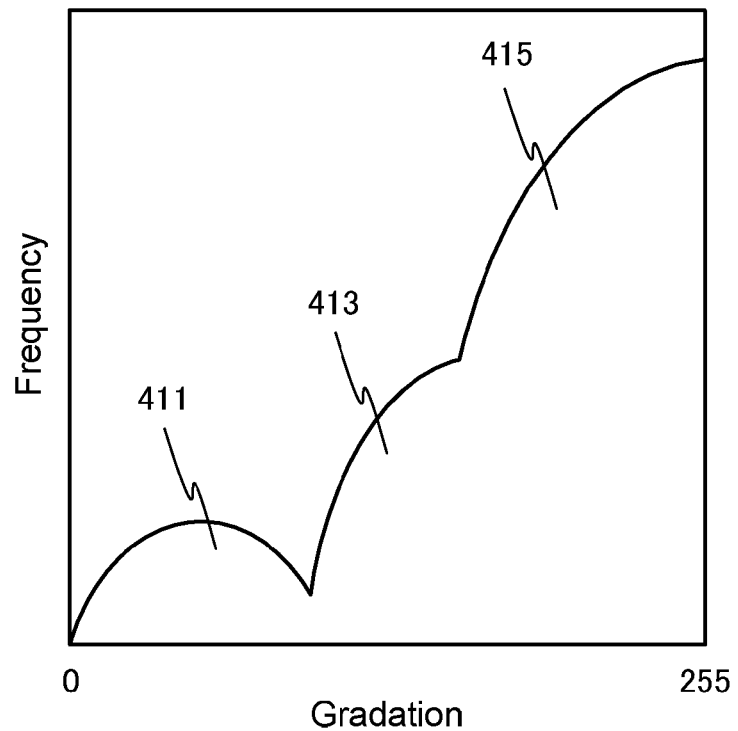
FIGS. 9A and 9B are histograms describing a binarization process.

When the histogram is formed from the image of FIG. 7A with, for example, 256 gray scales, a histogram as shown in FIG. 9A is obtained. Here, a distribution 411, a distribution 413, and a distribution 415 that form this histogram correspond to the region 401, the region 403, and the region 405 in FIG. 7A, respectively.

Among these regions, the region 401 in FIG. 7A is a position where detection is aimed, and a region with a darker shadow may be extracted in order to further improve accuracy.

Since the region 401 in FIG. 7A corresponds to the distribution 411 in FIG. 9A, the region 401 can be extracted by selecting a threshold value from the gray scales included in the distribution 411. In order to extract the region 401 with higher accuracy, as shown in FIG. 9B, gray scales are counted from those in the dark side of the shadows (dark side) until the count number above a certain level is detected so that a gray scale that reaches the number or a gray scale in the vicinity of the maximum value may be set to a threshold value.

Here, when the count number above a certain level or the maximum value is not detected, a subsequent image is obtained and a detection operation of a maximum value of the histogram is performed in a similar step.

Figure 9B:
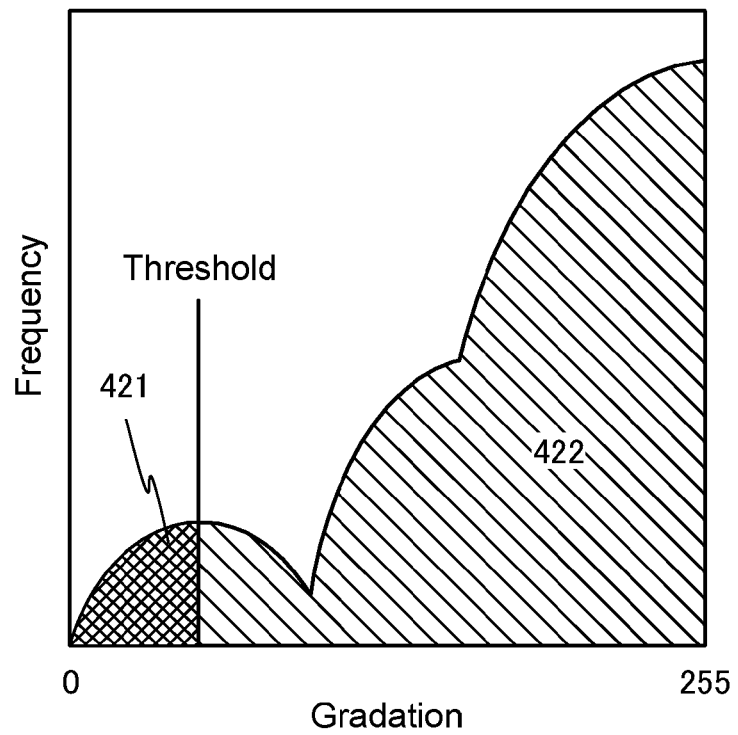

In such a manner, binarization of the gray scales can be performed to obtain a distribution 421 and a distribution 422, the displays at which are respectively darker and brighter than the display at the threshold value shown in FIG. 9B. This binarized state is shown as an image as illustrated in FIG. 7B, and a region 431 with a darker shadow in the region 401 in FIG. 7A can be extracted.

Figure 10:
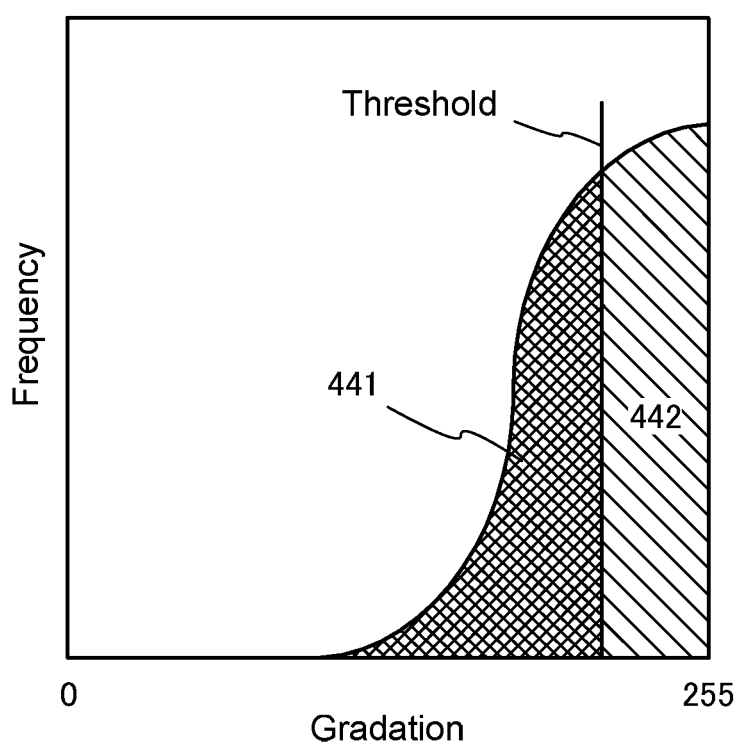
FIG. 10 is a histogram describing a binarization process.

When the display device is placed under an environment with strong external light, light passes under a fingertip or a pen nib; thus, the shadow is imaged relatively lightly. In such a case, the entire histogram is shifted to the light region; therefore, the threshold value can be determined in consideration of the amount of shift by counting the gray scales from those in the dark side (see FIG. 10). In this case, binarization of the gray scales can be performed to obtain a distribution 441 and a distribution 442, the displays at which are respectively darker and brighter than the display at the threshold value.

A shadow of a palm, a main body of a pen, or the like is imaged lighter than the shadow of a portion in contact with the display device. Thus, when gray scales are counted from those in a dark side of a histogram, a portion corresponding to the shadow of a fingertip or a pen nib is to be counted first. Therefore, even among the shadows of the same object to be detected, a shadow of a portion which is needed can be detected preferentially. In other words, counting gray scales of a histogram from those in a dark side is extremely effective.

The accurate position of an object to be detected such as a fingertip, a pen nib, or the like can be determined from the address of a pixel where a shadow is detected in such a manner; thus, the display device can recognize this series of operations as an input operation. That is, an operation as a touch panel can be provided to the display device.

This embodiment can be implemented in combination with any of the other embodiments or the examples as appropriate.

Embodiment 3

In this embodiment, a liquid crystal display device which is an example of the display device disclosed in this specification will be described.

Figure 11:
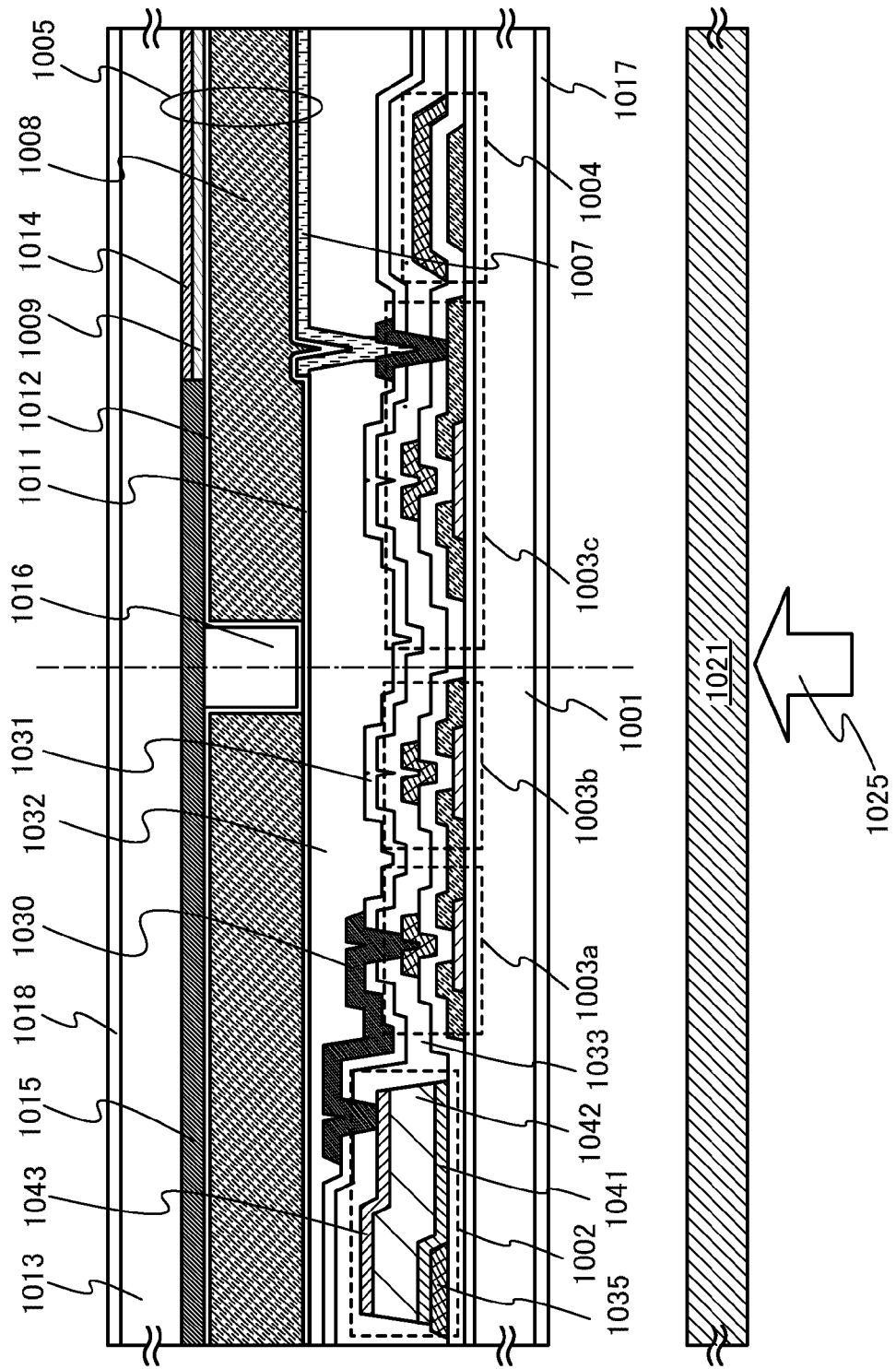
FIG. 11 is a cross-sectional view of a display device where a display region is provided with both a display element and a photosensor.

FIG. 11 illustrates an example of a cross-sectional view of a liquid crystal display device. In the liquid crystal display device in this embodiment, a photodiode 1002, a transistor 1003a, a transistor 1003b, a transistor 1003c, a storage capacitor 1004, and a liquid crystal element 1005 are provided over a substrate 1001 having an insulating surface. Note that a photosensor and a display element are partly shown on the left side and the right side, respectively, of a short dash line at the center of FIG. 11, and these structures are equivalent to the configuration of the pixel 104 described in Embodiment 1 (see FIG. 2).

Although a top-gate structure is illustrated as a typical example of the structure of each of the transistor 1003a, the transistor 1003b, and the transistor 1003c, without limitation thereto, another structure such as a self-aligned structure or a bottom-gate structure may be applied.

A wiring 1030 is connected to a gate electrode of the transistor 1003a which is provided for the photosensor and is electrically connected to a cathode of the photodiode 1002. This wiring 1030 corresponds to the gate signal line 213 illustrated in FIG. 2. Note that the wiring 1030 may be formed over an insulating film 1033 instead of a protective insulating film 1031.

One of a source electrode and a drain electrode of the transistor 1003a is connected to one of a source electrode and a drain electrode of the transistor 1003b, and the other of the source electrode and the drain electrode of the transistor 1003a is connected to a reference signal line which is not illustrated. In addition, the other of the source electrode and the drain electrode of the transistor 1003b is connected to an output signal line which is not illustrated.

The photodiode 1002 has a stacked-layer type of PIN junction which includes a p-type semiconductor layer 1041 containing an impurity imparting p-type conductivity, an i-type semiconductor layer 1042 having characteristics of an intrinsic semiconductor, and an n-type semiconductor layer 1043 containing an impurity imparting n-type conductivity.

As a typical example, a photodiode in which amorphous silicon is used for the i-type semiconductor layer 1042 can be given. Although amorphous silicon can be used also for the p-type semiconductor layer 1041 and the n-type semiconductor layer 1043 in this case, it is preferable to use microcrystalline silicon having high electrical conductivity. The photodiode in which amorphous silicon is used for the i-type semiconductor layer 1042 has photosensitivity in a visible light region and can prevent malfunction due to an infrared ray.

Note that the photodiode in which amorphous silicon is used for the i-type semiconductor layer 1042 corresponds to the first photodiode for detecting visible light, which is described in Embodiment 1. In order to form the second photodiode for detecting infrared rays, crystalline silicon may be used for the i-type semiconductor layer 1042. In Embodiment 1, an example in which microcrystalline silicon is used as the crystalline silicon is described.

Here, the p-type semiconductor layer 1041 which is an anode of the photodiode is electrically connected to a signal wiring 1035, and the n-type semiconductor layer 1043 which is a cathode of the photodiode is electrically connected to the gate electrode of the transistor 1003a as described above. Note that the signal wiring 1035 corresponds to the reset signal line 208 illustrated in FIG. 2.

Note that although not illustrated, a light-transmitting conductive layer may be provided on a light incident plane of the p-type semiconductor layer 1041. In addition, a conductive layer may be provided on an interface side with the insulating film 1033 of the n-type semiconductor layer 1043. For example, the wiring 1030 may be extended to cover the n-type semiconductor layer 1043. With such a conductive layer provided, loss of electric charge due to the resistance of the p-type semiconductor layer 1041 or the n-type semiconductor layer 1043 can be reduced.

Note that although the case where the photodiode 1002 is a PIN diode is illustrated in this embodiment, the photodiode 1002 may be a PN diode. In this case, high-quality crystalline silicon is preferably used for the p-type semiconductor layer and the n-type semiconductor layer.

Figure 12:
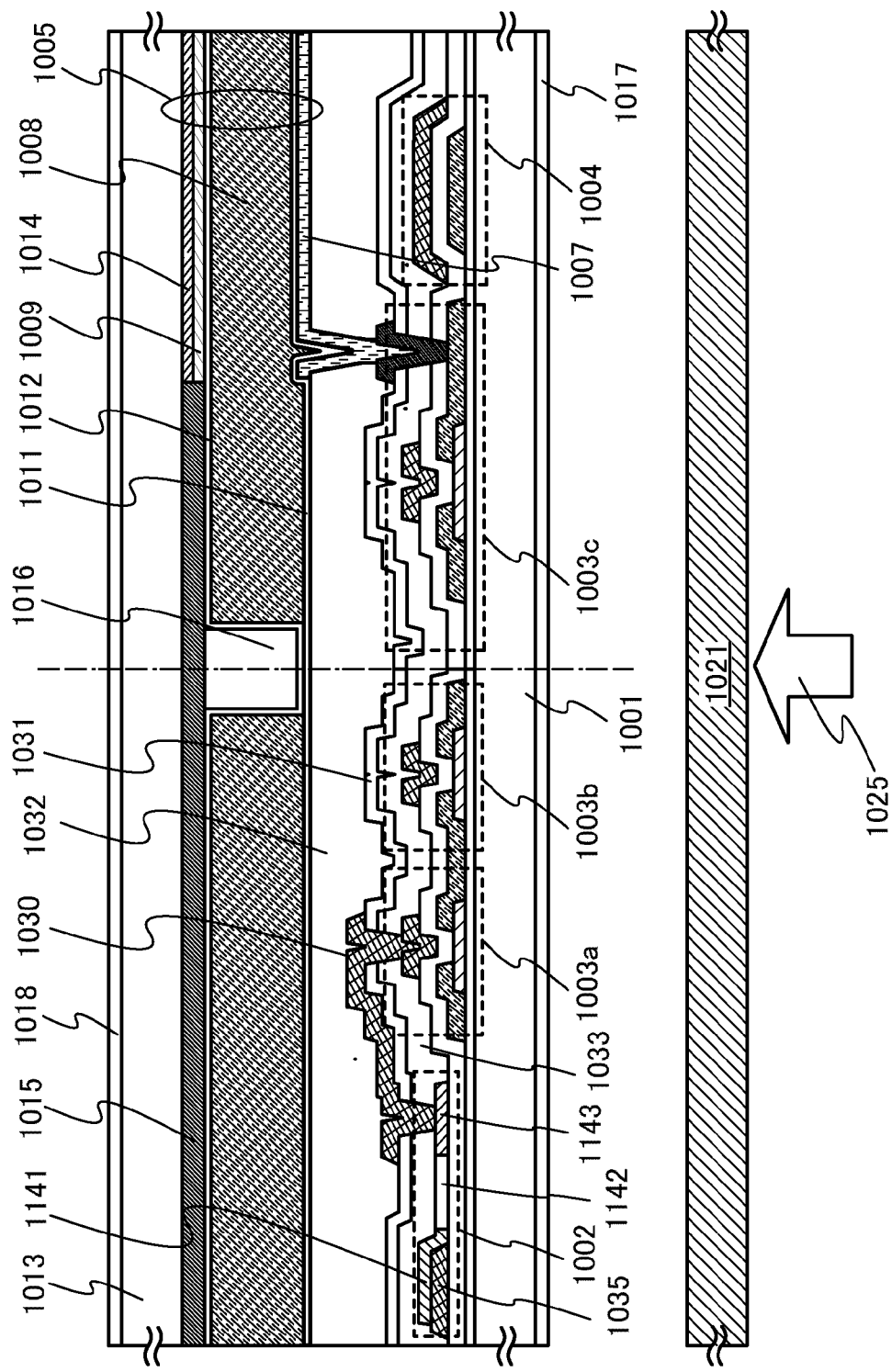
FIG. 12 is a cross-sectional view of a display device where a display region is provided with both a display element and a photosensor.

The photodiode may have a structure of a horizontal junction as illustrated in FIG. 12. In a PIN horizontal junction photodiode, a p-type semiconductor layer 1141, an i-type semiconductor layer 1142, and an n-type semiconductor layer 1143 can be provided as follows: an i-type semiconductor layer is formed, and an impurity imparting p-type conductivity and an impurity imparting n-type conductivity are added into part of the i-type semiconductor layer.

The transistor 1003c is provided in the display element to drive the liquid crystal element. One of a source electrode and a drain electrode of the transistor 1003c is electrically connected to a pixel electrode 1007, and although not illustrated, the other of the source electrode and the drain electrode thereof is electrically connected to the signal wiring.

The storage capacitor 1004 can be formed in the step of forming the transistor 1003a, the transistor 1003b, and the transistor 1003c. A capacitor wiring and a capacitor electrode of the storage capacitor 1004 are formed in respective steps of forming a gate electrode of the transistor and for forming a source or drain electrode thereof, and an insulating film which is a capacity of the storage capacitor 1004 is formed in a step of forming a gate insulating film of the transistor. The storage capacitor 1004 is electrically connected to one of the source electrode and the drain electrode of the transistor 1003c, in parallel to the liquid crystal element 1005.

The liquid crystal element 1005 includes the pixel electrode 1007, liquid crystals 1008, and a counter electrode 1009. The pixel electrode 1007 is formed over a planarization insulating film 1032 and is electrically connected to the transistor 1003c and the storage capacitor 1004. Further, the counter electrode 1009 is provided for a counter substrate 1013, and the liquid crystals 1008 are provided between the pixel electrode 1007 and the counter electrode 1009.

A cell gap between the pixel electrode 1007 and the counter electrode 1009 can be controlled by using a spacer 1016. Although the cell gap is controlled using the spacer 1016 which is selectively formed by photolithography and has a columnar shape in FIG. 11, the cell gap can alternatively be controlled by sphere spacers dispersed between the pixel electrode 1007 and the counter electrode 1009. The position of the spacer 1016 in FIG. 11 is an example, and the position of the spacer can be determined as appropriate by a practitioner.

Further, the liquid crystals 1008, between the substrate 1001 and the counter substrate 1013, are surrounded by a sealing material. The liquid crystals 1008 may be injected by a dispenser method (droplet method) or a dipping method (pumping method).

The pixel electrode 1007 can be formed using a light-transmitting conductive material such as indium tin oxide (ITO), indium tin oxide containing silicon oxide, organic indium, organic tin, zinc oxide, indium zinc oxide (IZO) containing zinc oxide, zinc oxide containing gallium, tin oxide, indium oxide containing tungsten oxide, indium zinc oxide containing tungsten oxide, indium oxide containing titanium oxide, indium tin oxide containing titanium oxide, or the like.

In addition, since the transparent liquid crystal element 1005 is given as an example in this embodiment, the counter electrode 1009 can also be formed using the above light-transmitting conductive material as in the case of the pixel electrode 1007.

An alignment film 1011 is provided between the pixel electrode 1007 and the liquid crystals 1008 and an alignment film 1012 is provided between the counter electrode 1009 and the liquid crystals 1008. The alignment film 1011 and the alignment film 1012 can be formed using an organic resin such as polyimide or polyvinyl alcohol. Alignment treatment such as rubbing is performed on their surfaces in order to align liquid crystal molecules in certain direction. Rubbing can be performed by rolling a roller wrapped with cloth of nylon or the like while pressure is applied on the alignment film so that the surface of the alignment film is rubbed in certain direction. By using an inorganic material such as silicon oxide, the alignment film 1011 and the alignment film 1012 each having an alignment property can be directly formed by evaporation method without performing alignment treatment.

Further, a color filter 1014 capable of transmitting light with a particular wavelength is provided for the counter substrate 1013 so as to overlap with the liquid crystal element 1005. The color filter 1014 can be selectively formed as follows: an organic resin such as an acrylic-based resin in which pigment is dispersed is applied on the counter substrate 1013 and is subjected to photolithography. Alternatively, the color filter 1014 can be selectively formed as follows: a polyimide-based resin in which pigment is dispersed is applied on the counter substrate 1013 and is subjected to etching.

Further alternatively, the color filter 1014 can be selectively formed by a droplet discharge method such as an ink-jet method. The color filter 1014 is not necessarily provided.

Further, a shielding film 1015 capable of shielding light is provided for the counter substrate 1013 so as to overlap with the photodiode 1002. The shielding film 1015 can prevent irradiation on the photodiode 1002 directly with light of the backlight passing through the counter substrate 1013. In addition, the shielding film 1015 can prevent disclination due to disorder of alignment of the liquid crystals 1008 among pixels from being observed. The shielding film 1015 can be formed using an organic resin containing black colorant such as carbon black or titanium lower oxide. Alternatively, the shielding film 1015 can be formed using a film of chromium.

Further, a polarizing plate 1017 is provided on the side of the substrate 1001, which is opposite to the side over which the pixel electrode 1007 is provided, and a polarizing plate 1018 is provided on the side of the counter substrate 1013, which is opposite to the side over which the counter electrode 1009 is provided.

The liquid crystal element can be a TN (twisted nematic) type, a VA (vertical alignment) type, an OCB (optically compensated birefringence) type, an IPS (in-plane switching) type, or the like. Although the liquid crystal element 1005 in which the liquid crystals 1008 are provided between the pixel electrode 1007 and the counter electrode 1009 is described as an example in this embodiment, the display device according to one embodiment of the present invention is not limited to this structure. A liquid crystal element in which a pair of electrodes is provided on the substrate 1001 side such as an IPS type liquid crystal element may also be employed.

External light to be detected by the photodiode 1002 enters the substrate 1001 in a direction indicated by an arrow 1025 to reach the photodiode 1002. For example, when an object 1021 to be detected exists, the object 1021 to be detected blocks external light, so that incidence of the external light into the photodiode 1002 is prevented. The liquid crystal display device can function as a touch panel by detecting light which thus enters the photodiode and a shadow thereof.

Further, an object to be detected may be in close contact with the substrate 1001 and external light passing through the object to be detected may be detected by the photodiode, so that the liquid crystal display device can function as a contact-type image sensor.

This embodiment can be implemented in combination with any of the other embodiments or the examples as appropriate.

Embodiment 4

In this embodiment, a liquid crystal display device which is an example of the display device according to one embodiment of the present invention, which is different from Embodiment 3, will be described.

Embodiment 3 can be referred to except for the description made below. For example, transistors, a photodiode, a liquid crystal element, and the like can be formed using the same materials as those in Embodiment 3.

Figure 13:
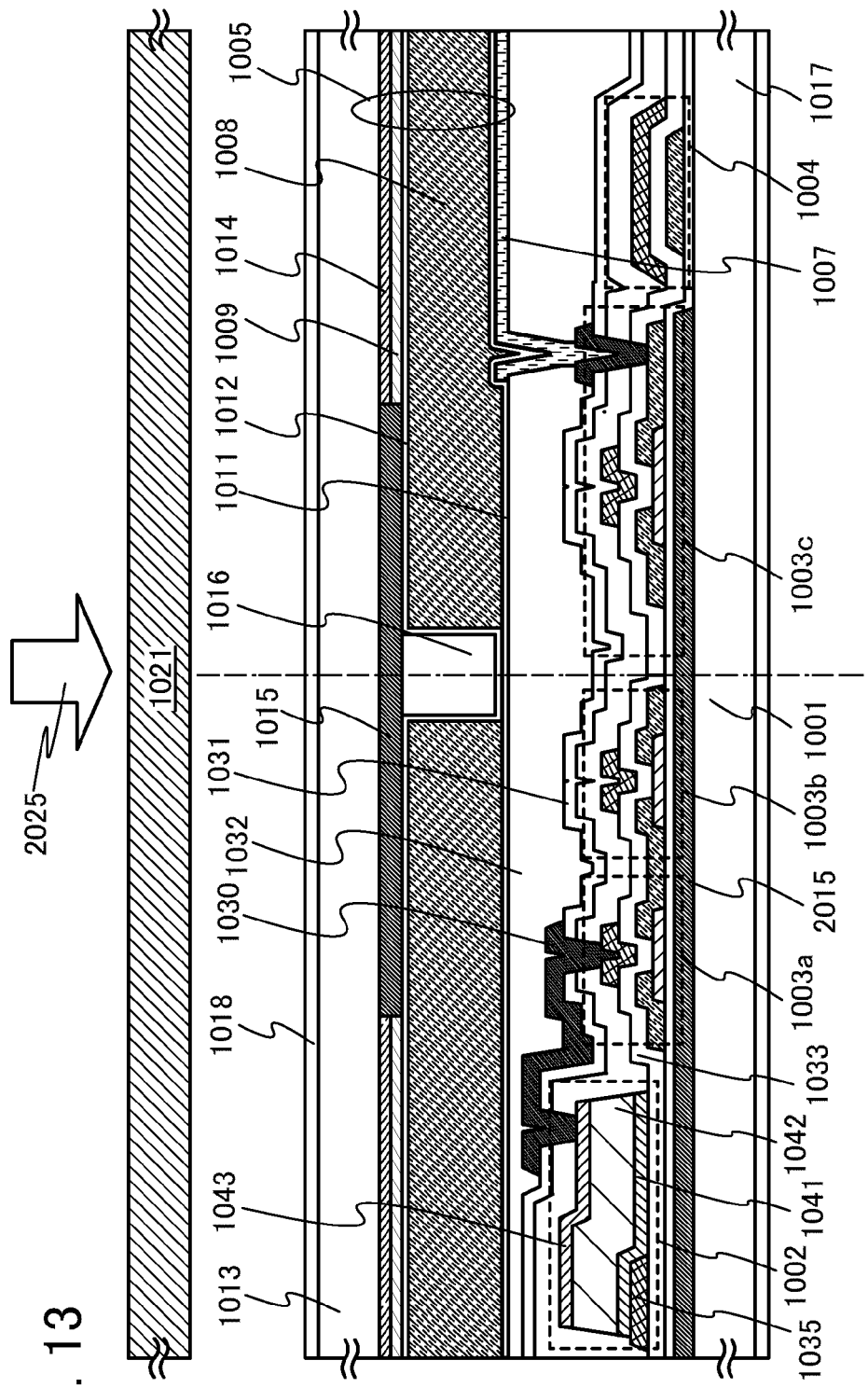
FIG. 13 is a cross-sectional view of a display device where a display region is provided with both a display element and a photosensor.

FIG. 13 is an example of a cross-sectional view of the display device which is different from Embodiment 3. Unlike Embodiment 3 in which light enters from the substrate side on which the photosensor is manufactured, light enters a photosensor from the counter substrate side, that is, through a liquid crystal layer in this embodiment.

Therefore, it is necessary to form an opening in a region of a shielding film 1015 provided for a counter substrate 1013, which overlaps with a photodiode 1002. A color filter 1014 may be formed in the opening as illustrated in a drawing. A plurality of photosensors provided with color filters with colors R (red), G (green), and B (blue) may be provided in a pixel to form a color sensor, so that a color image sensor function can be provided.

Moreover, in order to form the photodiode for detecting infrared rays described in Embodiment 1, provision of an infrared-ray transmitting filter at the position where the above color filter is formed is effective in addition to the use of a semiconductor layer of crystalline silicon or the like, which has sensitivity to infrared rays. Note that a red (R) color filter may be used for simplification.

Although light enters from the p-type semiconductor layer 1041 side of the photodiode 1002 in Embodiment 3, light enters from the n-type semiconductor layer 1043 side in this embodiment with a structure similar to that of Embodiment 3. The reason why light is made to enter from the p-type semiconductor layer side is that holes whose diffusion length is short can be effectively taken out, that is, a larger amount of current can be taken out from the photodiode, and light may enter from the n-type semiconductor layer side as long as a design current value is satisfied.

In this embodiment, the p-type semiconductor layer 1041 and the n-type semiconductor layer 1043 may be counter-changed each other in the photodiode 1002, so that light can easily enter from the p-type semiconductor layer side. Note that in that case, the operation method is different from that described in Embodiment 3 because the gate electrode is connected to the transistor 1003*a* on the p-type semiconductor layer (anode) side. Embodiment 1 can be referred to for each operation method.

Figure 14:
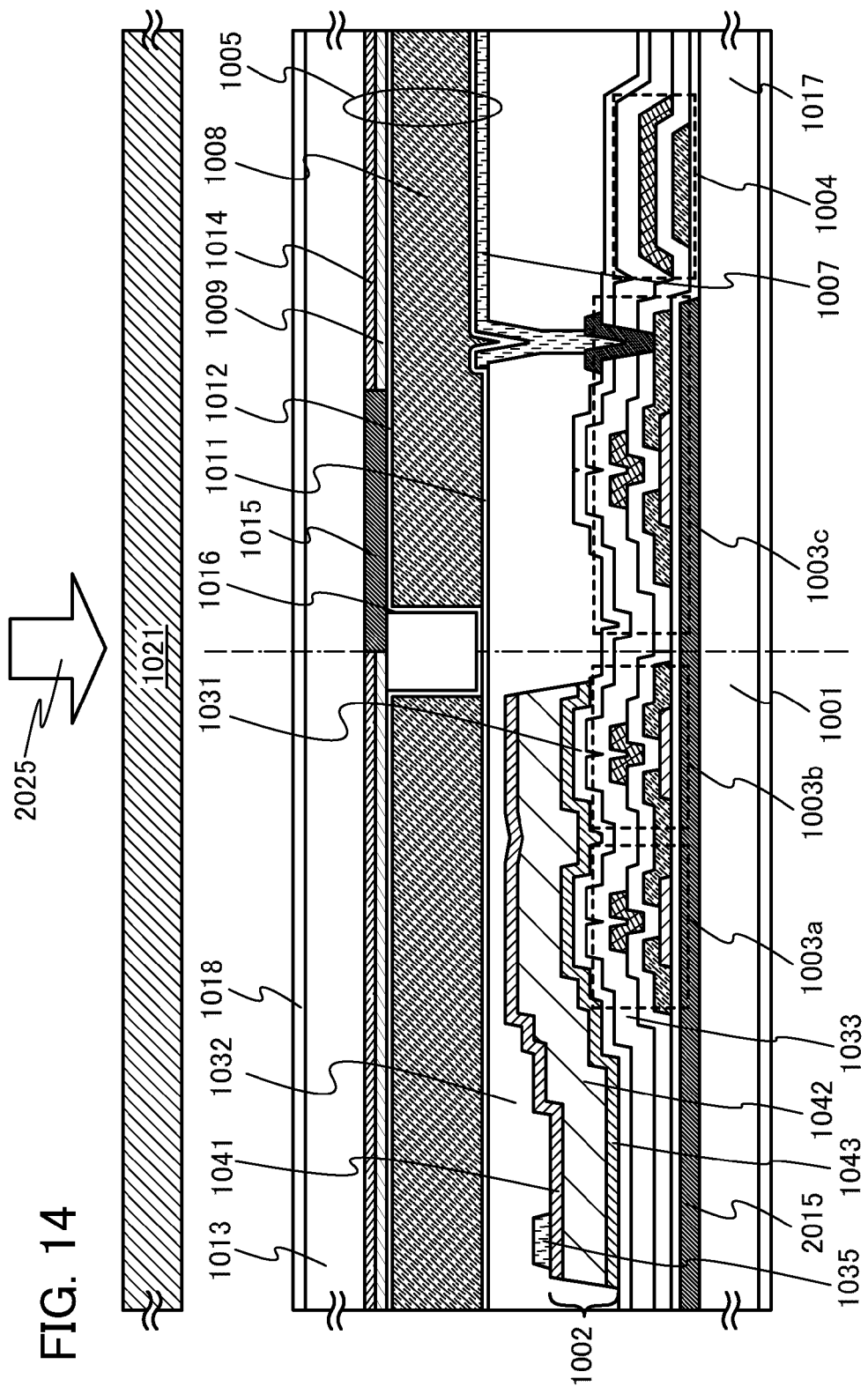
FIG. 14 is a cross-sectional view of a display device where a display region is provided with both a display element and a photosensor.

A photodiode 1002 may be formed to overlap with and over a transistor 1003*a* and a transistor 1003*b* as illustrated in FIG. 14. It is needless to say that the photodiode 1002 may overlap with one of the transistors. In this case, a gate electrode of the transistor 1003*a* can be easily connected to an n-type semiconductor layer 1043 of the photodiode 1002, and light can enter from the p-type semiconductor layer 1041 side. Further, the photodiode can be formed to have a large area, thereby improving the light-receiving sensitivity.

Although not illustrated, a light-transmitting conductive layer may be provided on the light incidence side of the photodiode 1002 in any of FIG. 13 and FIG. 14. A conductive layer may be provided on the side opposite to the light incidence side of the photodiode 1002. With such a conductive layer provided, loss of electric charge due to the resistance of the p-type semiconductor layer 1041 or the n-type semiconductor layer 1043 can be reduced.

In this embodiment, a shielding film 2015 is provided on the side opposite to the light-receiving side of the photodiode 1002. The shielding film 2015 prevents the photodiode 1002 from being directly irradiated with light from the backlight that passes through a substrate 1001 and enters the display panel, so that high-accuracy imaging can be performed. The shielding film 2015 can be formed using an organic resin containing black colorant such as carbon black or titanium lower oxide. Alternatively, the shielding film 2015 can be formed using a film of chromium.

External light to be detected by the photodiode 1002 enters the counter substrate 1013 in a direction indicated by an arrow 2025 to reach the photodiode 1002. For example, when an object 1021 to be detected exists, the object 1021 to be detected blocks external light, so that incidence of the external light into the photodiode 1002 is blocked out. The liquid crystal display device can function as a touch panel by detecting the intensity of light which thus enters the photodiode.

Further, an object to be detected may be in close contact with the counter substrate 1013 and external light passing through the object may be detected by the photodiode, so that the liquid crystal display device can function as a contact-type image sensor can be provided.

This embodiment can be implemented in combination with any of the other embodiments or the examples as appropriate.

Embodiment 5

In this embodiment, an example of a writing board (such as a blackboard and a whiteboard) using a display panel including a photosensor will be described.

Figure 15:
FIG. 15 illustrates an example of an electronic device using a display device according to one embodiment of the present invention.

For example, the display panel including a photosensor is provided at the position of a display panel 9696 in FIG. 15.

The display panel 9696 has a photosensor and a display element.

Here, it is possible to write freely with a marker pen or the like on the surface of the display panel 9696.

Note that it is easy to erase letters if the letters are written with a marker pen or the like without a fixer.

In addition, it is preferable that the surface of the display panel 9696 be adequately smooth in order that the ink of the marker pen may be easily removed.

For example, the surface of the display panel 9696 has sufficient smoothness when a glass substrate or the like is used for the surface of the display panel 9696.

Alternatively, a transparent synthetic resin sheet or the like may be attached to the surface of the display panel 9696.

Acrylic resin, for example, is preferably used as the synthetic resin. In this case, the surface of the sheet of synthetic resin is preferably smooth.

In addition, since the display panel 9696 includes a display element, the display panel 9696 can display a particular image and at the same time, it is possible to write down letters or the like on the surface of the display panel 9696 with a marker pen.

Further, the display panel 9696 includes the photosensor, so that letters written with the marker pen can be read and printed out if the display panel 9696 is connected to a printer or the like.

Further, since the display panel 9696 includes the photosensor and the display element, by writing text, drawing figures, or the like on the surface of the display panel 9696 with an image displayed, a trail of the marker pen read by the photosensor and the image can be synthesized and displayed on the display panel 9696.

Note that sensing with resistive touch sensors, capacitive touch sensors, or the like can be performed only at the same time as writing with a marker pen or the like.

On the other hand, sensing with a photosensor is superior in that sensing can be performed anytime after something is written with a marker or the like, even if time passes.

This embodiment can be implemented in combination with any of the other embodiments or the examples as appropriate.

Example 1

Figure 16:
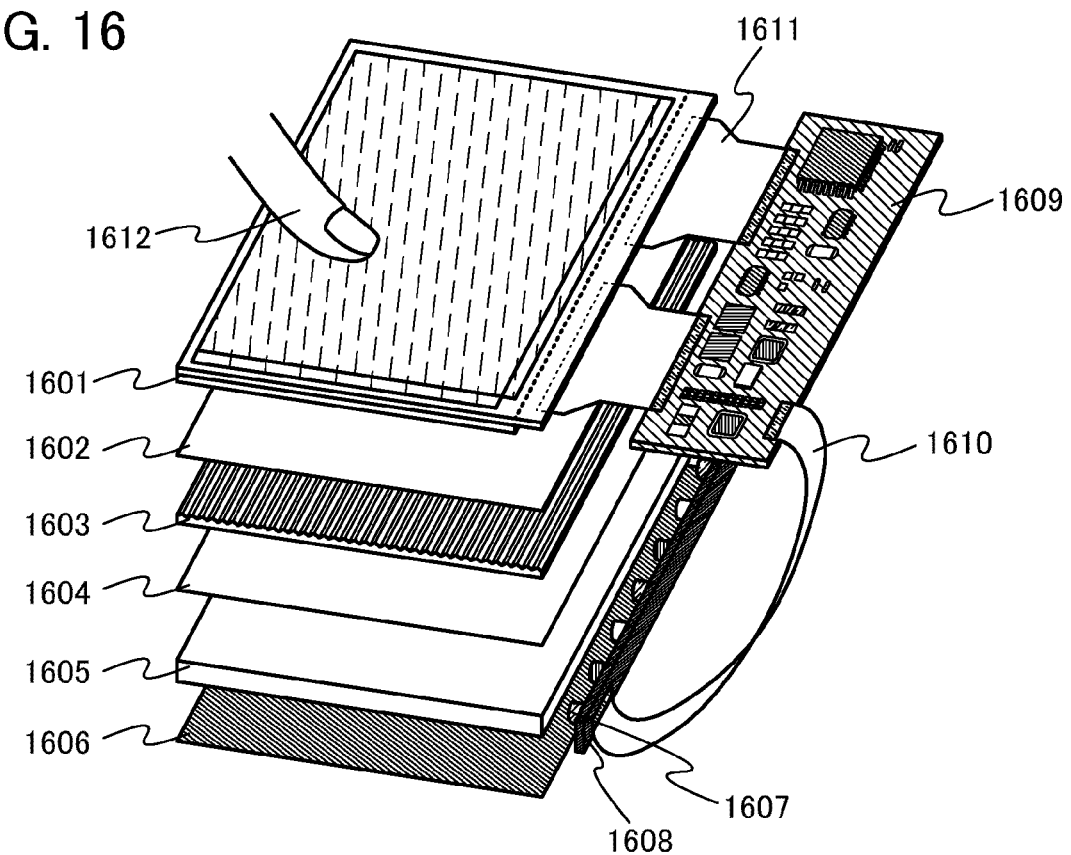
FIG. 16 illustrates a structure of a display device according to one embodiment of the present invention.

In this example, positions of a panel and a light source will be described. FIG. 16 is an example of a perspective view illustrating the structure of a display panel according to one embodiment of the present invention. A display panel illustrated in FIG. 16 includes a panel 1601 in which a pixel including a liquid crystal element, a photodiode, a thin film transistor, and the like is formed between a pair of substrates; a first diffuser plate 1602; a prism sheet 1603; a second diffuser plate 1604; a light guide plate 1605; a reflector plate 1606; a backlight 1608 including a plurality of light sources 1607; and a circuit board 1609.

The panel 1601, the first diffuser plate 1602, the prism sheet 1603, the second diffuser plate 1604, the light guide plate 1605, and the reflector 1606 are stacked sequentially. The light sources 1607 are provided at an end portion of the light guide plate 1605. Light from the light sources 1607 diffused into the light guide plate 1605 is uniformly delivered from the counter substrate side on the panel 1601 with the help of the first diffuser plate 1602, the prism sheet 1603, and the second diffuser plate 1604.

Although the first diffuser plate 1602 and the second diffuser plate 1604 are used in this example, the number of diffuser plates is not limited thereto. The number of diffuser plates may be one, or may be three or more. The diffuser plate may be provided between the light guide plate 1605 and the panel 1601. Therefore, the diffuser plate may be provided only on the side closer to the panel 1601 than the prism sheet 1603, or may be provided only on the side closer to the light guide plate 1605 than the prism sheet 1603.

Further, the shape of the cross section of the prism sheet 1603, which is illustrated in FIG. 16, is not only serrate, and the shape may be a shape with which light from the light guide plate 1605 can be gathered to the panel 1601 side.

The circuit board 1609 is provided with a circuit for generating or processing various signals inputted to the panel 1601, a circuit for processing various signals outputted from the panel 1601, and the like. In FIG. 16, the circuit board 1609 and the panel 1601 are connected to each other via a flexible printed circuit (FPC) 1611. Note that the above circuit may be connected to the panel 1601 by a chip on glass (COG) method, or part of the above circuit may be connected to the FPC 1611 by a chip on film (COF) method.

FIG. 16 illustrates an example in which the circuit board 1609 is provided with a control circuit for controlling driving of the light source 1607, and the control circuit and the light source 1607 are connected to each other via an FPC 1610. However, the control circuit may be formed over the panel 1601, and in that case, the panel 1601 and the light sources 1607 are made to be connected to each other via an FPC or the like.

Note that although FIG. 16 illustrates an edge-light type light source in which the light sources 1607 are provided on the edge of the panel 1601, the display panel according to one embodiment of the present invention may be a direct-below type display panel in which the light sources 1607 are provided directly below the panel 1601.

For example, when a finger 1612 which is an object to be detected gets close to the panel 1601 from the upper side, part of light that passes through the panel 1601 from the backlight 1608 reflects off the finger 1612 and enters the panel 1601 again. Color image data of the finger 1612 which is the object to be detected can be obtained by sequentially lighting the light sources 1607 that correspond to individual colors and obtaining image data of every color. Further, the position of the finger 1612 which is the object to be detected can be recognized from the image data, with which data of a display image can be combined to provide a function as a touch panel.

This embodiment can be implemented in combination with any of the other embodiments or the examples as appropriate.

Example 2

A display device according to one embodiment of the present invention is characterized by obtaining image data with high resolution. Therefore, an electronic device using the display device according to one embodiment of the present invention can have a higher function by adding the display device as a component.

For example, the display device according to one embodiment of the present invention can be included in display devices, laptop computers, or image reproducing devices provided with recording media (typically devices which reproduce the content of recording media such as DVDs (digital versatile disc) and have displays for displaying the reproduced images). In addition to the above examples, as electronic devices which include the display device according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of these electronic devices are illustrated in FIGS. 17A to 17C.

Figure 17A:
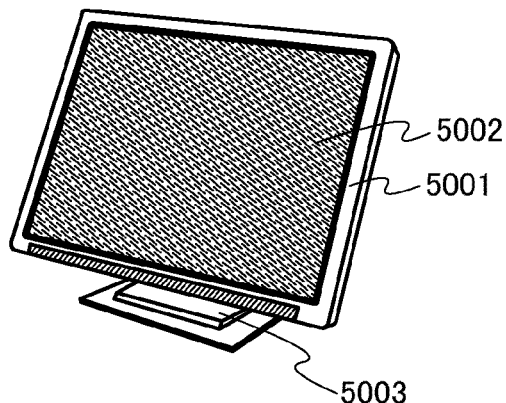
FIGS. 17A to 17C each illustrate an example of an electronic device using a display device according to one embodiment of the present invention.

FIG. 17A illustrates a display device, which includes a housing 5001, a display portion 5002, a support base 5003, and the like. The display device according to one embodiment of the present invention can be used for the display portion 5002. The use of a display device according to one embodiment of the present invention for the display portion 5002 can provide a display device capable of obtaining image data with high resolution and capable of being equipped with higher-functional applications. Note that the display device includes all of information display devices for personal computers, TV receivers, advertisement displays, and the like.

Figure 17B:
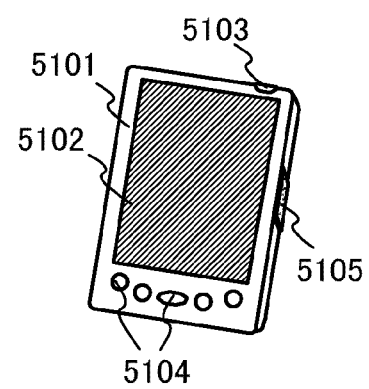

FIG. 17B illustrates a portable information terminal, which includes a housing 5101, a display portion 5102, a switch 5103, operation keys 5104, an infrared port 5105, and the like. The display device according to one embodiment of the present invention can be used for the display portion 5102. The use of the display device according to one embodiment of the present invention for the display portion 5102 can provide a portable information terminal capable of obtaining image data with high resolution and capable of being equipped with higher-functional applications.

Figure 17C:
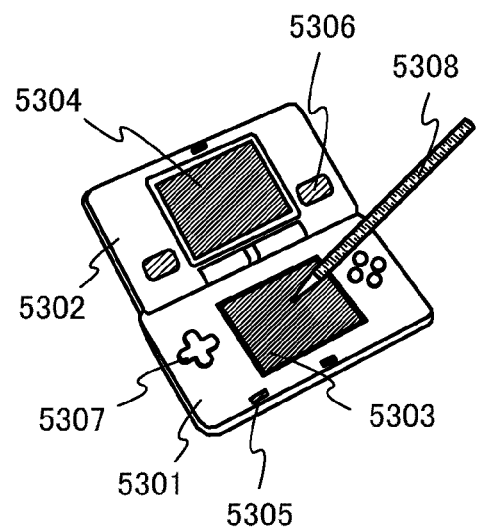

FIG. 17C illustrates a portable game machine, which includes a housing 5301, a housing 5302, a display portion 5303, a display portion 5304, a microphone 5305, speakers 5306, an operation key 5307, a stylus 5308, and the like. The display device according to one embodiment of the present invention can be used for the display portion 5303 or the display portion 5304. The use of the display device according to one embodiment of the present invention for the display portion 5303 or the display portion 5304 can provide a portable game machine capable of obtaining image data with high resolution and capable of being equipped with higher-functional applications. Note that although the portable game machine illustrated in FIG. 17C includes two display portions, the display portion 5303 and the display portion 5304, the number of display portions included in the portable game machine is not limited thereto.

This example can be implemented in combination with any of the embodiments or the other examples as appropriate.

This application is based on Japanese Patent Application serial No. 2010-034731 filed with the Japan Patent Office on Feb. 19, 2010, the entire contents of which are hereby incorporated by reference.

EXPLANATION OF REFERENCE

100: display device, 101: pixel circuit, 102: display element control circuit, 103: photosensor control circuit, 104: pixel, 105: display element portion, 106a: first photosensor portion, 106b: second photosensor portion, 107: display element driver circuit, 108: display element driver circuit, 109: photosensor reading circuit, 110: photosensor driver circuit, 201: transistor, 202: storage capacitor, 203: liquid crystal element, 204a: first photodiode, 204b: second photodiode, 205: transistor, 206: transistor, 207: gate signal line, 208: reset signal line, 209: selection signal line, 210: source signal line, 211: output signal line, 212: reference signal line, 213: gate signal line, 300: precharge circuit, 301: transistor, 302: storage capacitor, 303: precharge signal line, 401: region, 403: region, 405: region, 411: distribution, 413: distribution, 415: distribution, 421: distribution, 431: region, 441: distribution, 442: distribution, 1001: substrate, 1002: photodiode, 1004: storage capacitor, 1005: liquid crystal element, 1007: pixel electrode, 1008: liquid crystal, 1009: counter electrode, 1011: alignment film, 1012: alignment film, 1013: counter substrate, 1014: color filter, 1015: shielding film, 1016: spacer, 1017: polarizing plate, 1018: polarizing plate, 1021: object to be detected, 1025: external light, 1030: wiring, 1031: protective insulating film, 1032: planarization insulating film, 1033: insulating film, 1035: signal wiring, 1041: p-type semiconductor layer, 1042: i-type semiconductor layer, 1043: n-type semiconductor layer, 1003*a*: transistor, 1003*b*, transistor, 1003*c*: transistor, 1141: p-type semiconductor layer, 1142: i-type semiconductor layer, 1143: n-type semiconductor layer, 1601: panel, 1602: diffuser plate, 1603: prism sheet, 1604: diffuser plate, 1605: light guide plate, 1606: reflector, 1607: light source, 1608: backlight, 1609: circuit board, 1610: FPC, 1611: FPC, 1612: object to be detected, 2015: shielding film, 5001: housing, 5002: display portion, 5003: support base, 5101: housing, 5102: display portion, 5103: switch, 5104: operation key, 5105: infrared port, 5301: housing, 5302: housing, 5303: display portion, 5304: display portion, 5305: microphone, 5306: speaker, 5307: operation key, 5308: stylus, 9696: display panel.

The invention claimed is:

1. A display device comprising:
a display region comprising a first pixel and a second pixel, the first pixel comprising:
a first semiconductor of a first transistor;
a second semiconductor of a second transistor;
an insulating film over the first semiconductor and the second semiconductor;
a first photodiode comprising a third semiconductor over the insulating film, the first photodiode electrically connected to the first transistor; and
a first display element over the insulating film, the first display element electrically connected to the second transistor; and
the second pixel comprising:
a fourth semiconductor of a third transistor;
a fifth semiconductor of a fourth transistor;
the insulating film over the fourth semiconductor and the fifth semiconductor;
a second photodiode comprising a sixth semiconductor over the insulating film, the second photodiode electrically connected to the third transistor; and
a second display element over the insulating film, the second display element electrically connected to the fourth transistor,
wherein the first photodiode is configured to detect visible light,
wherein a sensitivity of the first photodiode is adjustable, and
wherein the second photodiode is configured to detect an infrared ray.

2. A display device comprising:
a display region comprising a first pixel and a second pixel; and
a driving circuit electrically connected to the display region,
wherein the first pixel comprises:
a first semiconductor of a first transistor;
a second semiconductor of a second transistor;
an insulating film over the first semiconductor and the second semiconductor;
a first photodiode comprising a third semiconductor over the insulating film, the first photodiode electrically connected to the first transistor; and
a first display element over the insulating film, the first display element electrically connected to the second transistor,
wherein the second pixel comprises:
a fourth semiconductor of a third transistor;
a fifth semiconductor of a fourth transistor;
the insulating film over the fourth semiconductor and the fifth semiconductor;
a second photodiode comprising a sixth semiconductor over the insulating film, the second photodiode electrically connected to the third transistor; and
a second display element over the insulating film, the second display element electrically connected to the fourth transistor,
wherein the first photodiode is configured to detect visible light,
wherein a sensitivity of the first photodiode is adjustable, and
wherein the second photodiode is configured to detect an infrared ray.

3. The display device according to claim 1 or claim 2, wherein the first photodiode is a PIN-type photodiode in which amorphous silicon is used for an i-type semiconductor layer.

4. The display device according to claim 1 or claim 2, wherein the second photodiode is a PIN-type photodiode in which crystalline silicon is used for an i-type semiconductor layer.

5. The display device according to claim 1 or claim 2, wherein the second photodiode is provided with a filter which transmits infrared rays and absorbs visible light.

6. The display device according to claim 1 or claim 2, wherein each of the first display element and the second display element is a liquid crystal element.

7. The display device according to claim 1 or claim 2, wherein each of the first display element and the second display element is a light-emitting element.

8. An electronic device comprising the display device according to claim 1 or claim 2.

9. The display device according to claim 1 or claim 2,
wherein the third semiconductor is a different material from the first semiconductor and the second semiconductor, and
wherein the sixth semiconductor is a different material from the fourth semiconductor and the fifth semiconductor.

10. The display device according to claim 1 or claim 2, wherein each of the first semiconductor, the second semiconductor, the fourth semiconductor and the fifth semiconductor comprises an oxide semiconductor.

11. A method for driving a display device, the display device comprising:
a display element portion formed in a pixel of a display region;
a first photosensor portion formed in the pixel, which is provided together with the display element portion; and
a second photosensor portion formed in another pixel without the first photosensor portion, which is provided together with another display element portion,
the method for driving the display device comprising:
changing light reception sensitivity of the first photosensor portion by intensity of an infrared ray which is detected by the second photosensor portion when light is received;
converting intensity of light detected by the first photosensor portion to signals;
forming from the signals a histogram where a horizontal axis represents a gray scale;
counting gray scales of the histogram from the gray scales in a dark side;
setting a gray scale which reaches a count number set in advance to a threshold value;

performing binarization of an image at a boundary of the threshold value to obtain a bright portion and a dark portion; and determining a position of an object to be detected in the display region using an address of a pixel of the dark portion.

12. A method for driving a display device, the display device comprising:

- a display element portion formed in a pixel of a display region;
- a first photosensor portion formed in the pixel, which is provided together with the display element portion; and
- a second photosensor portion formed in another pixel without the first photosensor portion, which is provided together with another display element portion, the method for driving the display device comprising:

- external light entering the display region;
- detecting an infrared ray included in the external light by the second photosensor portion;
- selecting either the first photosensor portion or the second photosensor portion as a unit which is used for imaging in accordance with an amount of infrared rays detected by the second photosensor portion;
- performing imaging using visible light when the first photosensor portion is used;
- performing imaging using an infrared ray when the second photosensor portion is used;
- converting intensity of light detected by the first photosensor portion or the second photosensor portion to signals;
- forming from the signals a histogram where a horizontal axis represents a gray scale;
- counting gray scales of the histogram from the gray scales in a dark side;
- setting a gray scale which reaches a count number set in advance to a threshold value;
- performing binarization of an image at a boundary of the threshold value to obtain a bright portion and a dark portion; and
- determining a position of an object to be detected in the display region using an address of a pixel of the dark portion.

* * * * *